US012653030B2

(12) United States Patent
Polomoff et al.

(10) Patent No.: US 12,653,030 B2
(45) Date of Patent: Jun. 9, 2026

(54) DOUBLE-SIDED INTEGRATED CIRCUIT WITH ELECTROSTATIC GUARD RING

(71) Applicant: International Business Machines Corporation, Armonk, NY (US)

(72) Inventors: Nicholas Alexander Polomoff, Hopewell Junction, NY (US); Terence Hook, Jericho Center, VT (US); Matthew Stephen Angyal, Stormville, NY (US); Brent A. Anderson, Jericho, VT (US); Lawrence A. Clevenger, Saratoga Springs, NY (US); Kisik Choi, Watervliet, NY (US); Fee Li Lie, Albany, NY (US); Ruilong Xie, Niskayuna, NY (US); Lei Zhuang, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 18/216,923

(22) Filed: Jun. 30, 2023

(65) Prior Publication Data

US 2025/0006663 A1      Jan. 2, 2025

(51) Int. Cl.
*H01L 23/58* (2006.01)
*H01L 21/768* (2006.01)
(Continued)

(52) U.S. Cl.
CPC ...... *H01L 23/585* (2013.01); *H01L 21/76898* (2013.01); *H01L 23/481* (2013.01);
(Continued)

(58) Field of Classification Search
CPC . H01L 23/585; H01L 23/481; H01L 23/5226; H01L 23/562; H01L 23/564;
(Continued)

(56) References Cited

U.S. PATENT DOCUMENTS

| | | | |
|---|---|---|---|
| 4,167,840 | A | 9/1979 | Ivany |
| 4,939,881 | A | 7/1990 | Reinle |

(Continued)

FOREIGN PATENT DOCUMENTS

| | | | |
|---|---|---|---|
| AU | 2022256088 B2 | 11/2022 | |
| DE | 102019200152 A1 | 8/2022 | |

(Continued)

OTHER PUBLICATIONS

Deepu Roy et al., "Comb capacitor structures for on-chip physical uncloneable function," IEEE transactions on semiconductor manufacturing, vol. 22, No. 1, 2009, pp. 96-102.

(Continued)

*Primary Examiner* — Dao H Nguyen
(74) *Attorney, Agent, or Firm* — Harrity & Harrity, LLP

(57) ABSTRACT

A structure includes a semiconductor substrate; a plurality of first dielectric layers at a top side of the substrate; an active device layer at a top side of the first layers; a plurality of second dielectric layers at a top side of the device layer; first and second sense pads; and a metal body that electrically connects the pads. The metal body includes a first portion that is embedded in the first layers, made of a first plurality of discrete segments; a second portion that is embedded in the second layers, made of a second plurality of discrete segments, of which a first is electrically connected to the first pad and a second is electrically connected to the second pad; and a plurality of vias that interconnect the first and second portions. Breaking any of the vias reduces the electrical connectivity between the pads.

10 Claims, 31 Drawing Sheets

(51) Int. Cl.

| | |
|---|---|
| *H01L 23/00* | (2006.01) |
| *H01L 23/48* | (2006.01) |
| *H01L 23/522* | (2006.01) |
| *H01L 25/065* | (2023.01) |

(52) U.S. Cl.
CPC ........ *H01L 23/5226* (2013.01); *H01L 23/562* (2013.01); *H01L 23/564* (2013.01); *H01L 24/05* (2013.01); *H01L 24/08* (2013.01); *H01L 25/0657* (2013.01); *H01L 2224/08145* (2013.01); *H01L 2225/06541* (2013.01); *H01L 2924/19041* (2013.01)

(58) Field of Classification Search
CPC ............... H01L 23/522; H01L 23/5286; H01L 21/76898; H01L 24/05; H01L 24/08; H01L 25/0657; H01L 2224/08145; H01L 2224/19041; H01L 2225/06541
See application file for complete search history.

(56) References Cited

U.S. PATENT DOCUMENTS

| | | | |
|---|---|---|---|
| 6,001,730 | A | 12/1999 | Farkas et al. |
| 6,071,809 | A | 6/2000 | Zhao |
| 6,117,782 | A | 9/2000 | Lukanc et al. |
| 6,218,290 | B1 | 4/2001 | Schonauer et al. |
| 6,448,661 | B1 | 9/2002 | Kim et al. |
| 6,521,542 | B1 | 2/2003 | Armacost et al. |
| 6,609,235 | B2 | 8/2003 | Ramaswamy et al. |
| 6,628,501 | B2 | 9/2003 | Toyoda |
| 6,667,225 | B2 | 12/2003 | Hau-Riege et al. |
| 6,690,569 | B1 | 2/2004 | Mayer et al. |
| 6,770,554 | B1 | 8/2004 | Welstand |
| 6,834,547 | B2 | 12/2004 | Chen |
| 6,841,413 | B2 | 1/2005 | Liu et al. |
| 7,232,761 | B2 | 6/2007 | Li et al. |
| 7,262,481 | B1 | 8/2007 | Marques |
| 7,354,798 | B2 | 4/2008 | Pogge et al. |
| 7,375,023 | B2 | 5/2008 | Tsai et al. |
| 7,456,507 | B2 | 11/2008 | Yang |
| 7,494,931 | B2 | 2/2009 | Fukushima et al. |
| 7,544,602 | B2 | 6/2009 | Clevenger et al. |
| 7,679,200 | B2 | 3/2010 | Su et al. |
| 7,791,175 | B2 | 9/2010 | Pyeon |
| 7,795,705 | B2 | 9/2010 | Tsutsue |
| 7,821,104 | B2 | 10/2010 | Lee et al. |
| 7,843,052 | B1 | 11/2010 | Yoo et al. |
| 8,035,197 | B2 | 10/2011 | Tsutsue |
| 8,125,054 | B2 | 2/2012 | West et al. |
| 8,169,055 | B2 | 5/2012 | Gillis et al. |
| 8,227,839 | B2 | 7/2012 | West |
| 8,237,246 | B2 | 8/2012 | Angyal et al. |
| 8,334,582 | B2 | 12/2012 | Jeng et al. |
| 8,395,241 | B2 | 3/2013 | Yang et al. |
| 8,429,587 | B2 | 4/2013 | Kim |
| 8,461,021 | B2 | 6/2013 | Yaung et al. |
| 8,710,629 | B2 | 4/2014 | Bai et al. |
| 8,742,582 | B2 | 6/2014 | Lin |
| 8,742,583 | B2 | 6/2014 | Lin et al. |
| 8,859,390 | B2 | 10/2014 | Farooq et al. |
| 8,860,185 | B2 | 10/2014 | Yuan |
| 8,860,229 | B1 | 10/2014 | Lin |
| 8,932,951 | B2 | 1/2015 | Wu et al. |
| 9,059,167 | B2 | 6/2015 | Farooq |
| 9,064,879 | B2 | 6/2015 | Hung et al. |
| 9,076,664 | B2 | 7/2015 | Pelley et al. |
| 9,117,831 | B2 | 8/2015 | Yang et al. |
| 9,305,968 | B2 | 4/2016 | Qian et al. |
| 9,312,229 | B2 | 4/2016 | Chen et al. |
| 9,368,459 | B2 | 6/2016 | Furusawa et al. |
| 9,412,678 | B2 | 8/2016 | Hou et al. |
| 9,472,518 | B2 | 10/2016 | Farrens et al. |
| 9,613,177 | B2 | 4/2017 | Yuan et al. |
| 9,633,917 | B2 | 4/2017 | Tsai et al. |
| 9,634,001 | B2 | 4/2017 | Wann et al. |
| 9,640,489 | B2 | 5/2017 | Hung et al. |
| 9,646,966 | B2 | 5/2017 | Moroz |
| 9,666,566 | B1 | 5/2017 | Chen et al. |
| 9,673,154 | B2 | 6/2017 | Tsutsue et al. |
| 9,754,923 | B1 * | 9/2017 | Xie ..................... H01L 25/0657 |
| 9,761,540 | B2 | 9/2017 | Shih |
| 9,812,373 | B2 | 11/2017 | Fachmann et al. |
| 9,831,196 | B2 | 11/2017 | Yu et al. |
| 9,904,839 | B2 | 2/2018 | Sun et al. |
| 10,068,859 | B1 | 9/2018 | Polomoff et al. |
| 10,109,599 | B2 | 10/2018 | Christiansen et al. |
| 10,264,199 | B2 | 4/2019 | Takayanagi et al. |
| 10,312,201 | B1 | 6/2019 | Hu et al. |
| 10,396,042 | B2 | 8/2019 | Li et al. |
| 10,410,892 | B2 | 9/2019 | Lu et al. |
| 10,453,805 | B2 | 10/2019 | Liao et al. |
| 10,453,886 | B2 | 10/2019 | Takahashi et al. |
| 10,461,069 | B2 | 10/2019 | Lin |
| 10,490,513 | B2 | 11/2019 | Yang et al. |
| 10,566,300 | B2 | 2/2020 | Pozder et al. |
| 10,644,021 | B2 | 5/2020 | Lee et al. |
| 10,716,755 | B2 | 7/2020 | Pyon et al. |
| 10,847,443 | B2 | 11/2020 | Lin |
| 10,903,187 | B2 | 1/2021 | Interrante et al. |
| 11,031,352 | B2 | 6/2021 | Yu et al. |
| 11,239,191 | B2 | 2/2022 | Suzuki |
| 11,355,456 | B2 | 6/2022 | Borel |
| 11,367,623 | B2 | 6/2022 | Chen et al. |
| 11,482,499 | B2 | 10/2022 | Hu et al. |
| 11,527,651 | B2 | 12/2022 | Chen et al. |
| 11,664,268 | B2 | 5/2023 | Lin et al. |
| 11,735,477 | B2 | 8/2023 | Shieh et al. |
| 11,743,569 | B2 | 8/2023 | Wang et al. |
| 11,809,800 | B2 | 11/2023 | Brewer |
| 11,875,989 | B2 | 1/2024 | Umebayashi et al. |
| 11,908,739 | B2 | 2/2024 | Uzoh |
| 11,916,054 | B2 | 2/2024 | Enquist et al. |
| 11,942,501 | B2 | 3/2024 | Endo et al. |
| 11,973,090 | B2 | 4/2024 | Blanquart |
| 11,996,401 | B2 | 5/2024 | Chen et al. |
| 12,009,350 | B2 | 6/2024 | Suk et al. |
| 12,068,351 | B2 | 8/2024 | Shimotsusa |
| 12,086,516 | B2 | 9/2024 | Ho et al. |
| 12,094,817 | B2 | 9/2024 | Kang et al. |
| 12,119,301 | B2 * | 10/2024 | Wang .................... H01L 23/535 |
| 12,130,870 | B2 | 10/2024 | Ricci |
| 12,166,061 | B2 | 12/2024 | Umebayashi et al. |
| 12,176,373 | B2 | 12/2024 | Ebiko et al. |
| 12,199,048 | B2 | 1/2025 | Mallik et al. |
| 12,211,821 | B2 | 1/2025 | Chau et al. |
| 12,230,559 | B2 | 2/2025 | Carney et al. |
| 12,287,909 | B2 | 4/2025 | Trivedi et al. |
| 12,300,543 | B2 | 5/2025 | Koike et al. |
| 12,327,783 | B2 | 6/2025 | Yazdani |
| 12,341,125 | B2 | 6/2025 | Gao et al. |
| 12,353,863 | B2 | 7/2025 | Ebcioglu et al. |
| 12,381,166 | B2 | 8/2025 | Singh et al. |
| 12,388,005 | B2 | 8/2025 | Kim et al. |
| 12,394,758 | B2 | 8/2025 | Yu et al. |
| 12,408,439 | B2 * | 9/2025 | Chuang ............... H01L 23/5226 |
| 2002/0185664 | A1 | 12/2002 | Dixit et al. |
| 2004/0177685 | A1 | 9/2004 | Yokura |
| 2005/0014356 | A1 | 1/2005 | Pozder et al. |
| 2005/0253258 | A1 | 11/2005 | Steers et al. |
| 2006/0157702 | A1 | 7/2006 | Sukman-Prahofer et al. |
| 2007/0087067 | A1 | 4/2007 | Yuan et al. |
| 2008/0046853 | A1 | 2/2008 | Ruderer et al. |
| 2008/0096365 | A1 | 4/2008 | Chitnis |
| 2008/0120586 | A1 | 5/2008 | Hoerold |
| 2008/0203589 | A1 | 8/2008 | Bailey et al. |
| 2008/0277765 | A1 | 11/2008 | Lane et al. |
| 2010/0068844 | A1 | 3/2010 | Fazzio |
| 2010/0200960 | A1 | 8/2010 | Angyal et al. |
| 2010/0206737 | A1 | 8/2010 | Preisser |
| 2011/0033980 | A1 | 2/2011 | Chung |
| 2011/0193197 | A1 | 8/2011 | Farooq |
| 2011/0241178 | A1 | 10/2011 | Miki |
| 2012/0074519 | A1 | 3/2012 | Yeo et al. |

(56) References Cited

U.S. PATENT DOCUMENTS

| | | |
|---|---|---|
| 2012/0175774 A1 | 7/2012 | West et al. |
| 2012/0306065 A1 | 12/2012 | Bin Mohd Arshad |
| 2014/0011324 A1 | 1/2014 | Liu et al. |
| 2014/0070426 A1 | 3/2014 | Park et al. |
| 2014/0124900 A1 | 5/2014 | West et al. |
| 2014/0220735 A1 | 8/2014 | Teng et al. |
| 2015/0069609 A1 | 3/2015 | Farooq |
| 2015/0318258 A1 | 11/2015 | Sane et al. |
| 2015/0325531 A1 | 11/2015 | Dyer et al. |
| 2017/0040253 A1 | 2/2017 | Kim et al. |
| 2019/0109125 A1 | 4/2019 | Wu et al. |
| 2019/0164914 A1 | 5/2019 | Hu et al. |
| 2019/0287932 A1 | 9/2019 | Hu |
| 2019/0341371 A1 | 11/2019 | Waidhas et al. |
| 2020/0027860 A1 | 1/2020 | Chu |
| 2020/0168538 A1 | 5/2020 | Ong |
| 2020/0411636 A1 | 12/2020 | Kao |
| 2021/0125910 A1 | 4/2021 | Shih et al. |
| 2022/0037268 A1 | 2/2022 | Shen et al. |
| 2022/0157757 A1* | 5/2022 | Seok .................. H01L 21/6835 |
| 2022/0192042 A1 | 6/2022 | Kabir et al. |
| 2022/0252534 A1 | 8/2022 | Khor |
| 2022/0301981 A1 | 9/2022 | Chang |
| 2022/0359264 A1 | 11/2022 | Yu |
| 2022/0375860 A1 | 11/2022 | Huang |
| 2022/0415807 A1* | 12/2022 | Pawashe ............. H01L 23/3677 |
| 2023/0197614 A1* | 6/2023 | Majhi ................. H01L 23/5286 |
| | | 257/774 |
| 2023/0260867 A1* | 8/2023 | Huang ............... H01L 23/3677 |
| | | 257/774 |
| 2024/0047338 A1* | 2/2024 | Chen .................. H01L 23/3677 |
| 2025/0006590 A1 | 1/2025 | Polomoff et al. |
| 2025/0006629 A1 | 1/2025 | Polomoff et al. |
| 2025/0006664 A1 | 1/2025 | Polomoff et al. |
| 2025/0149465 A1 | 5/2025 | Polomoff et al. |
| 2025/0218899 A1* | 7/2025 | Datye ............... H01L 21/76898 |
| 2025/0300067 A1* | 9/2025 | Lee ..................... H01L 23/5226 |

FOREIGN PATENT DOCUMENTS

| | | |
|---|---|---|
| JP | 5121348 B2 | 1/2013 |
| TW | 490775 B | 6/2002 |
| TW | 559965 B | 11/2003 |
| TW | I664702 B | 7/2019 |

OTHER PUBLICATIONS

Paul J. Otterstedt, List of IBM Patents or Patent Applications Treated as Related, May 13, 2024, pp. 1-2.

Peter Mell and Timothy Grance, The NIST Definition of Cloud Computing, NIST Special Publication 800-145, Sep. 2011, cover, pp. i-iii and 1-3.

Lim et al. "Challenges in Developing Thin Profile, Smaller Flip Chip Bump Pitch FCBGA Packaging", 2018 IEEE International Conference on Semiconductor Electronics (ICSE), Aug. 2018, pp. 259-262, DOI: 10.1109/SMELEC.2018.8481319.

Park et al. "Controlling Die Warpage by Applying Under Bump Metallurgy for Fan-Out Package Process Applications", 2018 IEEE 68th Electronic Components and Technology Conference (ECTC), May 2018, pp. 1912-1919, DOI: 10.1109/ECTC.2018.00286.

Polomoff et al. "The Influence of Layer thickness on Crackstops' Mechanical Strength and Robustness," 2021 IEEE 71st Electronic Components and Technology Conference (ECTC), Jun. 2021, pp. 62-71, doi: 10.1109/ECTC32696.2021.00022.

Rabie et al., "Innovative Design of Crackstop Wall for 14nm Technology Node and Beyond," 2018 IEEE 68th Electronic Components and Technology Conference (ECTC), May 2018, pp. 460-466, doi: 10.1109/ECTC.2018.00074.

* cited by examiner

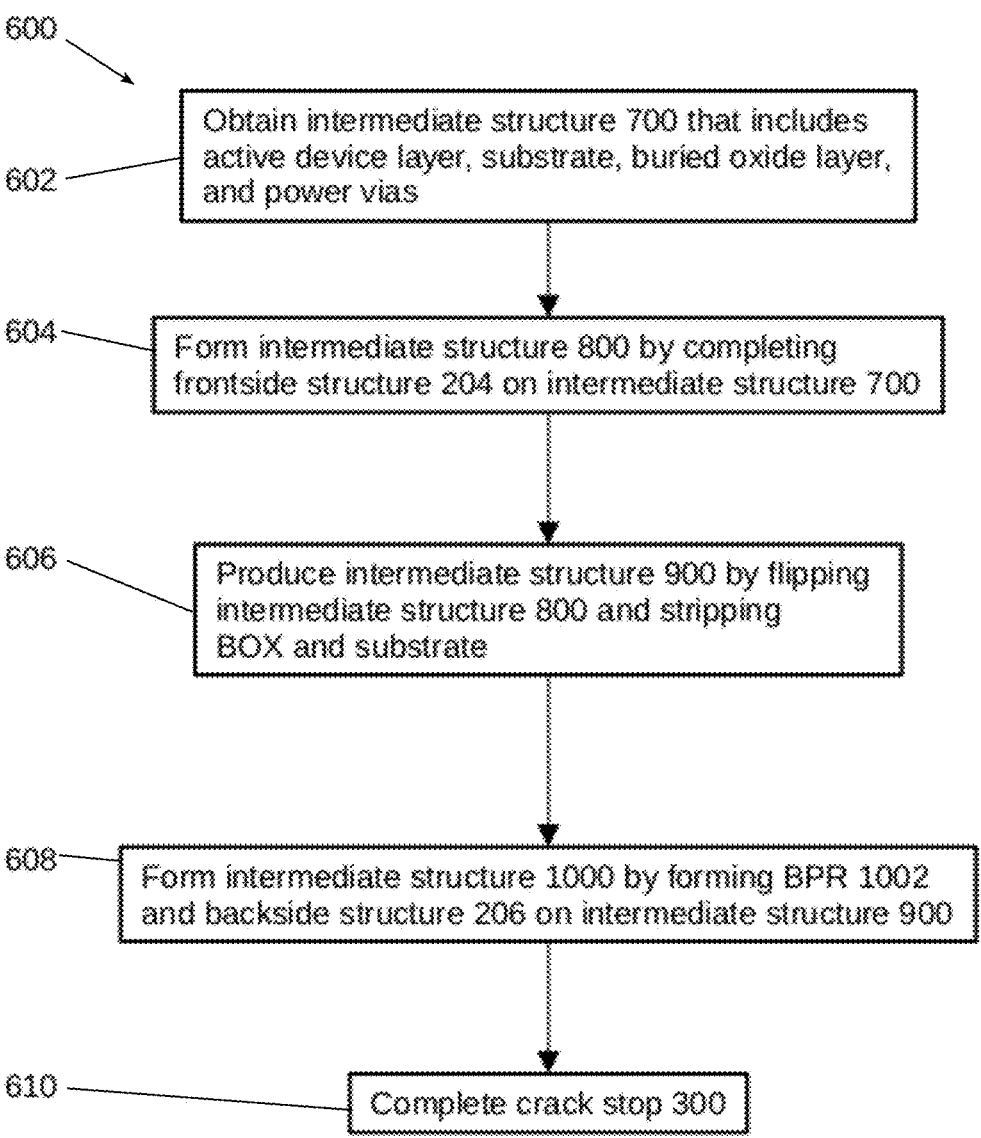

600

602 — Obtain intermediate structure 700 that includes active device layer, substrate, buried oxide layer, and power vias 604 — Form intermediate structure 800 by completing frontsidge structure 204 on intermediate structure 700

606 — Produce intermediate structure 900 by flipping intermediate structure 800 and stripping BOX and substrate 608 — Form intermediate structure 1000 by forming BPR 1002 and backside structure 206 on intermediate structure 900

610 — Complete crack stop 300

BPR

M1

M2

M3

1212    1208

1500

2300

2400

DOUBLE-SIDED INTEGRATED CIRCUIT WITH ELECTROSTATIC GUARD RING

BACKGROUND

The present invention relates to the electrical, electronic, and computer arts, and more specifically, to integrated circuit structures and fabrication processes. As very large scale integrated (VLSI) circuits have become more complex, with transistor feature sizes and pitches getting smaller, the number and density of wire traces in the metal layers has increased. Recently, metal layers have become density limited by physical limits to circuit performance (e.g., leakage currents and parasitic capacitances). In order to continue packing in more transistors, technology has advanced to use double-sided integrated circuit structures. As used herein, "double-sided integrated circuit structures" refers to integrated circuit structures in which an active device layer is located between a frontside structure (which includes multiple metal and dielectric layers) and a backside structure (which also includes multiple metal and dielectric layers). The sandwich or double-sided integrated circuit structure permits more metal traces to be formed, consistent with the physical limits of metal and dielectric materials. Another aspect of having wiring on both sides is to allow dedication of function to front versus back so that the wiring levels are equal at each side. This dedication avoids conflicts in use and simplifies the function on each side. For example: frontside is primary for circuit (signal) interconnection and backside is for power delivery.

SUMMARY

Principles of the invention provide techniques for a double-sided integrated circuit with electrostatic guard ring.

In one aspect, an exemplary structure includes: a semiconductor substrate; a plurality of first dielectric layers at a top side of the semiconductor substrate; an active device layer at a top side of the plurality of first dielectric layers; a plurality of second dielectric layers at a top side of the active device layer; first and second sense pads; and a metal body that electrically connects the first sense pad to the second sense pad. The metal body includes: a first portion that is embedded in the plurality of first dielectric layers, wherein the first portion includes a first plurality of discrete segments; a second portion that is embedded in the plurality of second dielectric layers, wherein the second portion includes a second plurality of discrete segments, of which a first segment is electrically connected to the first sense pad and a second segment is electrically connected to the second sense pad; and a plurality of vias that interconnect the first portion to the second portion through the active device layer, wherein each of the vias connects one of the first portion segments to one of the second portion segments in such a way that breaking any of the vias reduces the electrical connectivity of the metal body between the first sense pad and the second sense pad.

In another aspect, another exemplary structure includes: a semiconductor substrate, wherein the semiconductor substrate comprises a bonding layer; a plurality of first dielectric layers at a top side of the semiconductor substrate; an active device layer at a top side of the plurality of first dielectric layers; a plurality of second dielectric layers at a top side of the active device layer; first and second sense pads at a top side of the second dielectric layers; and a metal body that electrically connects the first sense pad to the second sense pad. The metal body comprises: a first portion that is embedded in the plurality of first dielectric layers, wherein the first portion includes a plurality of discrete segments, of which a first segment is electrically connected to the first sense pad and a second segment is electrically connected to the second sense pad; a conductive pattern, which is located in the semiconductor substrate and includes a plurality of discrete segments; and a plurality of electrical connections that interconnect the first portion to the conductive pattern through the bonding layer, wherein each of the electrical connections connects one of the first portion segments to one of the conductive pattern segments in such a way that breaking any of the electrical connections reduces the electrical connectivity of the metal body between the first sense pad and the second sense pad.

In a further aspect, a further structure includes: a semiconductor substrate, wherein the semiconductor substrate comprises a bonding layer; a plurality of first dielectric layers at a top side of the semiconductor substrate; an active device layer at a top side of the plurality of first dielectric layers; a plurality of second dielectric layers at a top side of the active device layer; first and second sense pads at a top side of the second dielectric layers; and a metal body that electrically connects the first sense pad to the second sense pad. The metal body includes: a conductive pattern, which is located in the semiconductor substrate below the bonding layer and includes a first plurality of discrete segments; a first portion that is embedded in the plurality of second dielectric layers, wherein the second portion includes a second plurality of discrete segments, of which a first segment is electrically connected to the first sense pad and a second segment is electrically connected to the second sense pad; and a plurality of vias that interconnect the second portion to the conductive pattern through the active device layer, the first dielectric layers, and the bonding layer, wherein each of the vias connects one of the second portion segments to one of the conductive pattern segments in such a way that breaking any of the vias reduces the electrical connectivity of the metal body between the first sense pad and the second sense pad.

In a still further aspect, a method for making a crack sensor for an integrated circuit structure includes: building an active device layer on a substrate, such that the active device layer is located outward of a plurality of first dielectric layers at a top side of the substrate and inward of a plurality of second dielectric layers; building smaller metal features at a frontside of the active device layer; building larger metal features onto the smaller metal features; inverting the structure; building smaller metal features adjacent to the backside of the active device layer; and building backside vias from the backside of the active device layer through the active device layer to smaller and larger metal features at the frontside of the active device layer. The frontside smaller metal features, the frontside larger metal features, the backside smaller metal features and the backside vias are built to form a metal body electrically interconnecting first and second sense pads In yet a further aspect, a method for making a crack sensor for an integrated circuit structure includes: building a structure from a plurality of first metal features adjacent a substrate; building a plurality of second metal features on the first metal features, the second metal features being smaller than the first metal features; building an active device layer outward of the second metal features, such that the active device layer is located outward of a plurality of first dielectric layers at a top side of the substrate and inward of a plurality of second dielectric layers; building third metal features on the active device layer; building fourth metal features on the third metal features, to obtain an intermediate structure, the fourth metal features being larger than the third metal features; and completing a stack including the intermediate structure. The first, second, third, and fourth metal features are built to form a metal body electrically interconnecting first and second sense pads.

In view of the foregoing, techniques of the present invention can provide substantial beneficial technical effects. For example, one or more embodiments provide one or more of:

A double-sided integrated circuit with improved durability of the active device layer.

A double-sided integrated circuit with improved resistance to cracking.

A double-sided integrated circuit with improved dissipation of electrostatic charges.

A double-sided integrated circuit with improved detection of cracks.

A double-sided integrated circuit with improved detection of moisture penetration.

A three dimensional mechanically bolting staple fill structure that can compensate for weaknesses in semiconductor structures using nanosheet transistors with backside power distribution networks (BSPDN).

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 3 through FIG. 10 depict a crack stop and its fabrication process, according to exemplary embodiments.

DETAILED DESCRIPTION

In developing methods for fabricating double-sided integrated circuit structures, we have discovered that these structures present certain challenges that were not appreciated earlier in their development. For example, the act of dicing a semiconductor wafer (typically, a 300 mm wide disc) into separate chips or dice presents challenges of mechanical cracking and electrostatic discharge.

Figure 1:
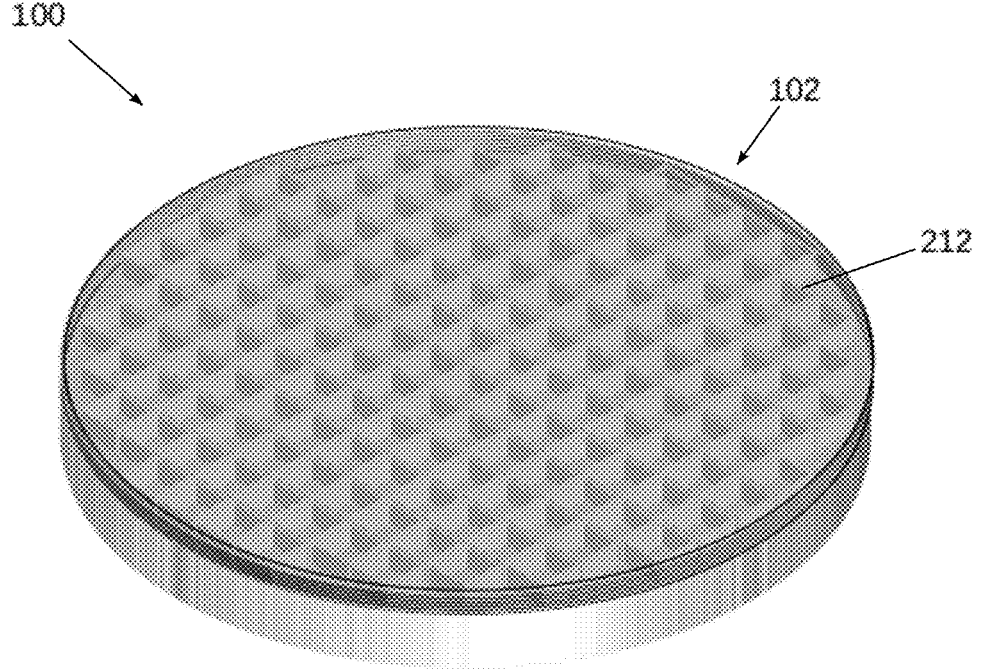
FIG. 1 depicts a wafer, according to exemplary embodiments.

FIG. 1 depicts a wafer 100, which is patterned with protective features (collectively, 102; in one or more embodiments, including conductive patterns 212 that anchor electrostatic guard rings, which are further discussed below with reference to FIG. 13 and FIG. 14) that separate individual chips 200, before the wafer is diced. For clarity, note that in one or more embodiments, patterns 212 are metal and therefore electrically conductive, but function as crackstop walls segmenting the wafer into different individual dies, and while the structure itself is metal it is provided for mechanical purposes and not meant to conduct electrical signals. The protective features 102 often are the same on each chip of the wafer, and lie along the chip sides of kerf regions that will be abraded or ablated by a cutting modality (e.g., a diamond blade, water jet, or laser beam) when the wafer is diced. As will be appreciated from FIGS. 2A and 2B, discussed below, one or more embodiments include a central region of back end of line (BEOL) stack and there is a device layer present in the middle of the BEOL stack; in one or more embodiments, the crackstop actually breaches through this active device layer.

Figure 2A:
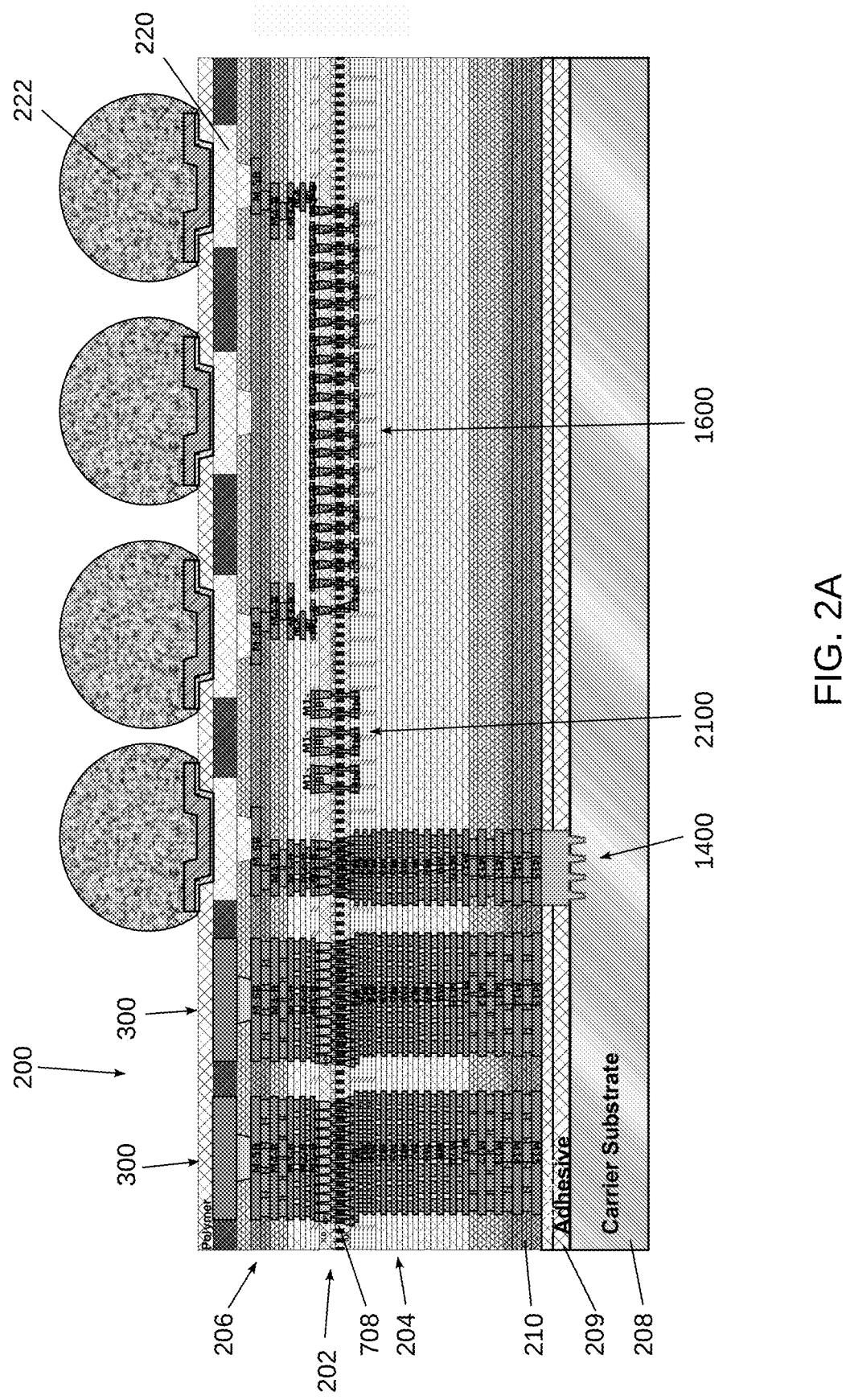
FIGS. 2A and 2B depict a chip, according to exemplary embodiments.
Figure 2B:
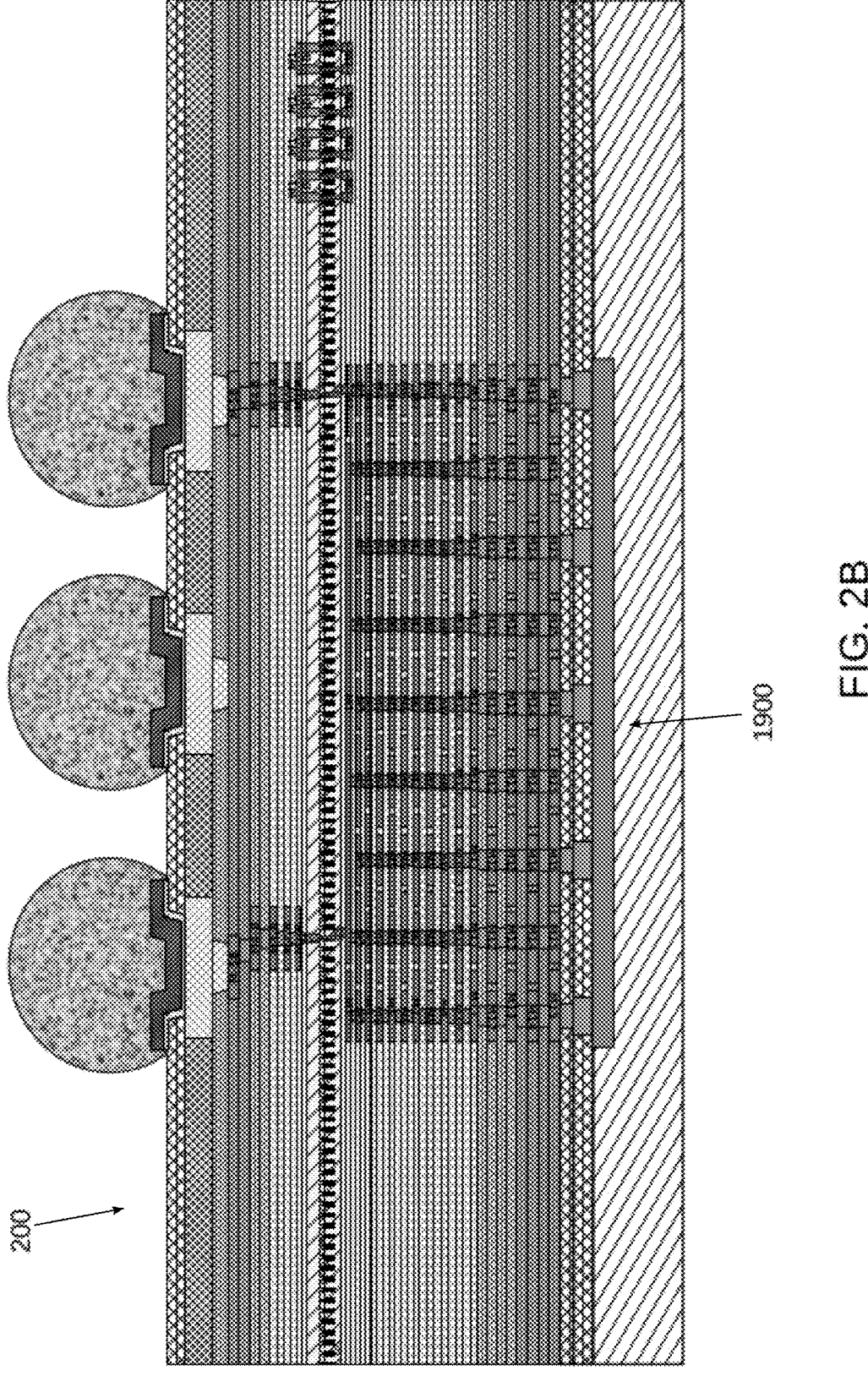

FIGS. 2A and 2B depict a portion of a chip 200 after it has been diced from the wafer 100. The chip 200 includes an active device layer 202, which is located between a first or frontside structure 204 (which includes a plurality of metal and dielectric layers) and a second or backside structure 206 (which also includes another plurality of metal and dielectric layers). A substrate 208 (in some embodiments, a carrier wafer) supports the other structures. A bonding layer 209 and a capping layer 210 attach the semiconductor substrate 208 to the rest of the integrated circuit. Oxide bonding is one non-limiting exemplary method. It can also be bonded with metal to metal bonding, or possibly by use of an adhesive, such as an organic adhesive, depending on the temperatures to be encountered in subsequent processes.

The active device layer 202 includes a plurality of active devices 708, which are shown generally in this exemplary embodiment as nanosheet gate-all-around (GAA) field effect transistors (FETs). However, the GAA FETs are illustrative of only some embodiments: aspects of the invention are equally applicable to fin-type field effect transistors (Fin-FETs) or to other metal-oxide-semiconductor (MOS) transistor technologies. The FETs have gates, drains, sources, and channel regions as is known to the skilled artisan. Non-limiting exemplary aspects of gate pitch are discussed elsewhere herein.

In the chip 200, several protective devices (e.g., 300, 1400, 1600, 1900, 2100) are formed in the frontside structure 204 and in the backside structure 206. Each of these devices typically bridge across the active device layer 202 from the frontside structure 204 to the backside structure 206. Some of the protective devices can be connected to external circuitry via contacts 220 and controlled collapse chip connectors (C4 connectors) 222. C4 bumps are a non-limiting example of connecting the chip to a board or another chip, could also use pillars and pads, wire binding, etc. While FIG. 2A and FIG. 2B show structures in addition to the protective devices, these additional structures are mere background to the inventive devices that are further described below; as such, the background components of FIG. 2A and FIG. 2B will be familiar to the ordinary skilled worker and are not described in detail herein.

As mentioned above, double-sided integrated circuits present certain challenges in fabrication.

One challenge is a tendency for such circuits to crack or "unzip" across the active device layer, which incorporates many small structures at finer feature sizes that make it relatively weak compared to the sturdier frontside and backside structures with their coarser feature sizes. Although crack propagation in itself is a well-known problem of integrated circuit fabrication, crack propagation specifically through an active device layer, which is located between frontside and backside layers, is a novel problem. One or more embodiments of protective devices that are discussed in this disclosure (the crack stops, the crack sensor, the moisture sensor, and the fill structure (e.g., 3D)) address the cracking challenge in specific ways as described herein.

Another challenge is electrostatic discharge during fabrication and particularly during dicing and later chip handling. Electrostatic discharge is not a new problem, and there are design rules to address it by including conductive features to mitigate capacitive charges. However, conductive features have not previously been expected to bridge across an active device layer. Exemplary embodiments of one of the protective devices, the electrostatic guard ring, advantageously address the electrostatic discharge challenge, and electrically isolate individual chips from neighboring chips. Indeed, one or more embodiments advantageously provide electrical isolation of an active device layer located in middle of the BEOL stack.

As mentioned, the example chip 200 includes at least one crack stop 300, an electrostatic guard ring 1400 or 1500 (described below with reference to FIG. 14 and FIG. 15), a crack sensor 1600, a moisture sensor 1900, and a plurality of fill structures (e.g., 3D) 2100. Each of these devices and alternate embodiments of such devices are discussed below with reference to specific drawing figures.

The Crack Stops

Figure 3:
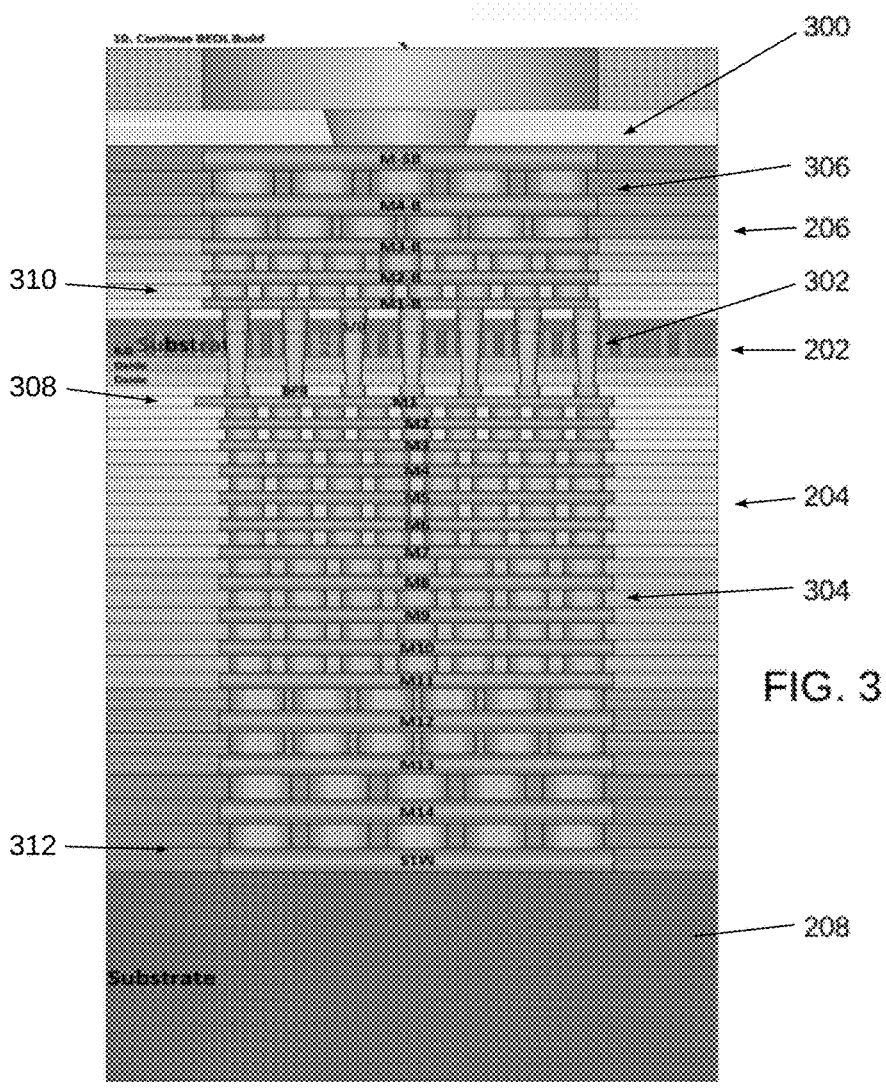
Figure 4:
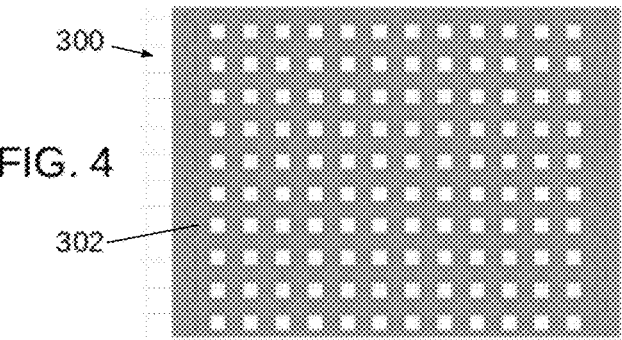
Figure 5:
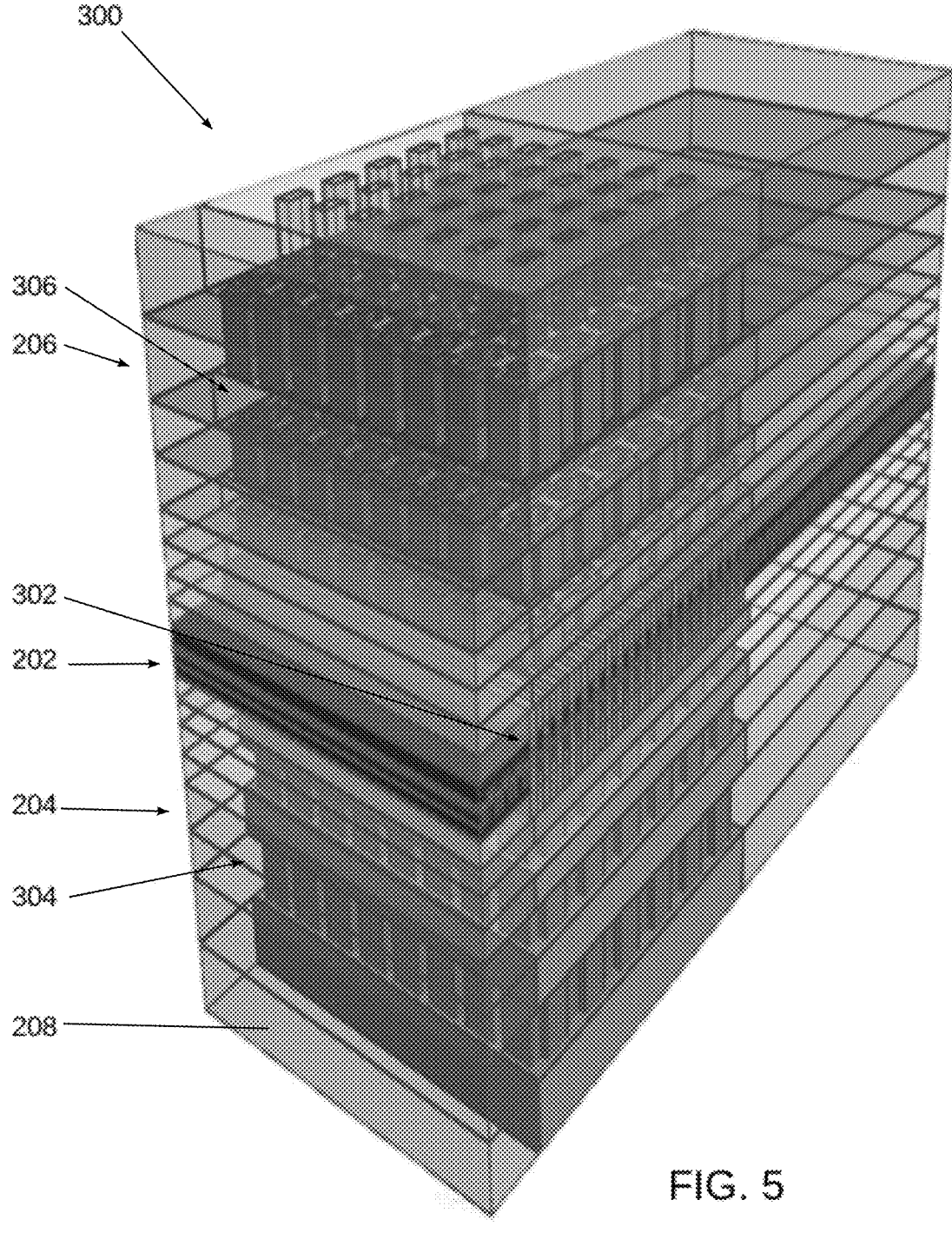

FIG. 3 through FIG. 10 depict an exemplary crack stop and its fabrication process. FIG. 3 is a side elevation view, FIG. 4 is a top plan view, and FIG. 5 is a perspective view of the crack stop 300. FIG. 6 is a flow chart that depicts steps of the fabrication process, while FIG. 7 through FIG. 10 are side elevation views of intermediate structures formed during the fabrication process. Although FIG. 6 through FIG. 10 depict the fabrication of a single crack stop structure, in practice, the steps of these drawings would be performed in parallel to fabrication of other structures, e.g., one or more additional crack stops, the guard ring 1400 and/or 1500 (described below with reference to FIG. 14 and FIG. 15), the crack sensor 1600, 1700, and/or 1800 (described below with reference to FIG. 16 through FIG. 18), the moisture sensor 1900 and/or 2000 (described below with reference to FIG. 19 through FIG. 20), the fill structures 2100 (e.g., 3D) (described below with reference to FIGS. 21A and 21B), and the active devices 708 in the active device layer 202.

In one or more embodiments, the crack stop 300 is in the form of a metal body, which is embedded into the frontside structure 204 and the backside structure 206. In one or more embodiments, the crack stop is a purely mechanical wall barrier (with no electrical connections) that extends throughout a semiconductor build stack. In one or more embodiments, the crack stop retards crack growth and/or inhibits moisture ingress into the active device region. Accordingly, in one or more embodiments the crack stop is in the form of a continuous ring that surrounds the perimeter of the active device region of the semiconductor die builds. The crack stop is also known as a Die Seal, Seal Ring, Moisture Barrier (MOB), Edge Seal, Edge Ring, etc. Each crack stop 300 incorporates a frontside or first portion 304 that includes a plurality of interconnected layers of frontside metal ("first metal," to encompass embodiments in which the wafer is flipped as well as embodiments in which the wafer is not flipped) that are embedded in the dielectric layers of the frontside structure 204, a backside or second portion 306 that includes a plurality of interconnected layers of backside metal ("second metal," to encompass embodiments in which the wafer is flipped as well as embodiments in which the wafer is not flipped) that are embedded in the dielectric layers of the backside structure 206, and a plurality of vias 302 that interconnect the frontside portion to the backside portion through the active device layer 202. In order to perform the functions of a crack stop, which include blocking, diverting, or stopping crack growth and propagation by dissipating crack growth and propagation energy, the crack stop 300 is formed as a continuous ring of interconnected line and via bars that entirely surround the perimeter of the semiconductor substrate in a "fishnet" type of structure (better seen in the plan view of FIG. 4 and perspective view of FIG. 5). Note that the "fishnet" is a non-limiting example and in general, patterns can be serpentine, straight bars or grids, and the like; generally, an interlocking network of via bars. The exemplary fishnet structure includes a metal mesh with openings between lines and vias, essentially providing a grid-like structure somewhat resembling a net used for fishing, as will be appreciated by the skilled artisan from the figures and description herein. The crack stop 300 extends vertically from the semiconductor substrate 208 to a top side of the backside structure 206. Again, in one or more embodiments, the crackstop is purely mechanical and can be used to create electrical isolation.

In one or more embodiments, the crack stop 300 includes bumper features 308, 310, 312, by which layers of metal are laterally offset and extended further out from the rest of the metal body (neighboring levels). For example, layers of metal may be offset toward a dicing edge or perimeter of a chip. Desirably, the bumper features guide crack propagation away from relatively fragile portions of the structure such as the active device layer or the interface between the substrate and the dielectric stack.

Figures 7, 8, 9, 10:
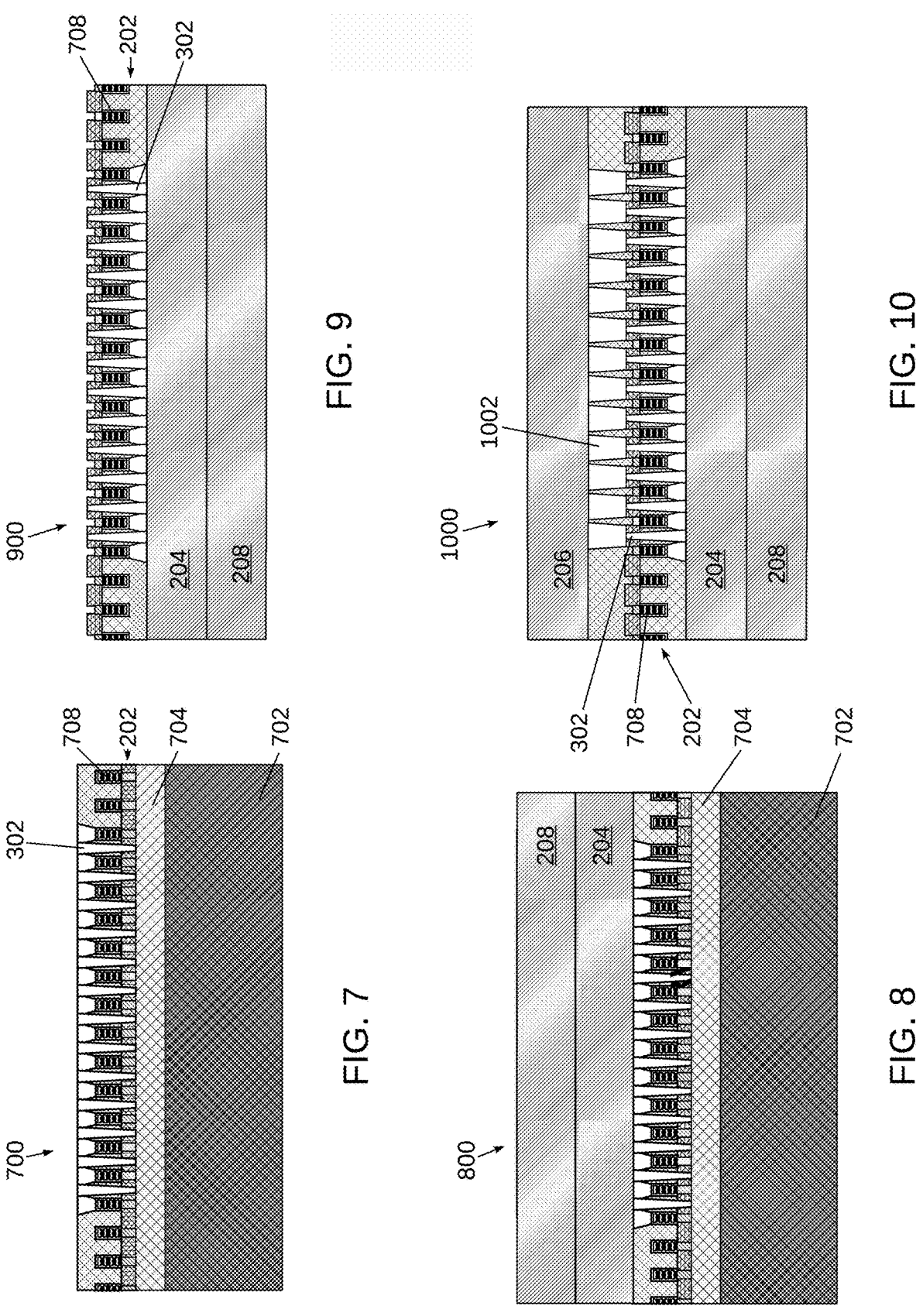

Referring to FIG. 6, the exemplary fabrication process 600 includes several steps. Beginning at 602, an intermediate structure 700 (as shown in FIG. 7) is obtained or formed by conventional methods. The intermediate structure 700 includes the active device layer 202, atop a substrate 702 and a bonding layer 704. In the active device layer 202, vias 302 are filled by conventional methods to provide structural metal between the devices 708. The devices 708 are superfluous to the function of the crack stop 300 and are optional in the portion of the active device layer 202 where the crack stop is to be formed. They are illustrated in the drawing views for convenience, in order to reinforce the point that in one or more non-limiting exemplary embodiments, most of the active device layer 202 has such devices, which typically render it mechanically weaker than the rest of the integrated circuit body.

At 604, the frontside structure 204 is completed by conventional methods to form intermediate structure 800 (as shown in FIG. 8), which includes a full BEOL stack (the frontside structure 204, shown schematically) and a carrier wafer (the semiconductor substrate 208). At 606, the structure 800 is flipped and the bonding layer and substrate are stripped by conventional methods to produce an intermediate structure 900 (as shown in FIG. 9). Then at 608, backside vias 1002 and the rest of the backside structure 206 (shown schematically) are formed by conventional methods to form an intermediate structure 1000 (as shown in FIG. 10). At this point, it should be noted that the backside vias 1002 are not actually connected to electrical power. As mentioned above, the crack stop 300 is electrically isolated. At 610, the crack stop 300 is completed as shown in FIG. 3.

Another option for building the crack stop 300 is to start from the substrate with relatively large features, build on layers of increasingly smaller or finer features up to the active device layer, and then build on further layers of increasingly larger or coarser features up to the top of the stack. This method can advantageously enhance alignment of features across layers by avoiding the step(s) of flipping the wafer one or more times.

Figures 11, 12:
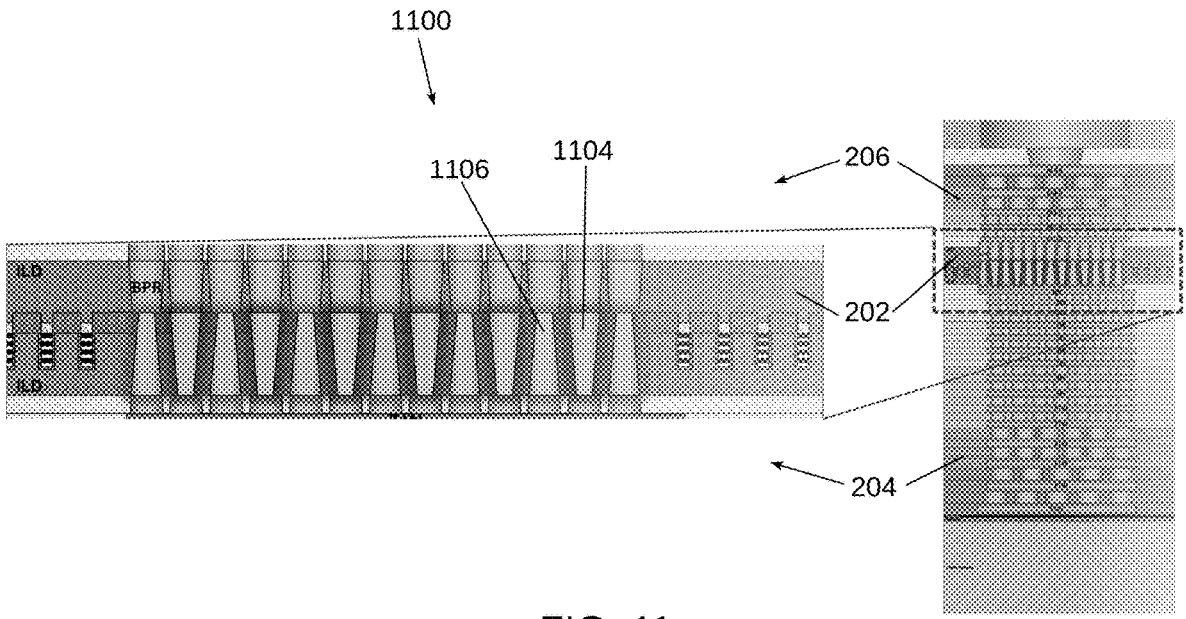
FIG. 11 depicts a variant crack stop, according to exemplary embodiments.
FIG. 12 depicts a variant crack stop, according to exemplary embodiments.

FIG. 11 depicts a variant crack stop 1100. Structures similar to those of preceding figures are similarly numbered. The mechanical crack stop barrier structure 1100 has been built into and along with a semiconductor device build of device layers higher in the BEOL stack. It includes via bars 1104, 1106 that penetrate the active device layer 202, and the via bars are of mixed orientation (up and down); that is, a first group of the via bars 1104 are wider toward the frontside structure 204 while a second group of the via bars 1106 are wider toward the backside structure 206. In one or more embodiments, the via bars are arranged in alternating fashion, that is, each via bar 1104 is next to a via bar 1106. The differing profiles of the via bars 1104, 1106 reflect the times at which they were formed by a damascene process, i.e. the via bars 1104 were formed during fabrication of the frontside structure 204 whereas the via bars 1106 were formed during fabrication of the backside structure 206. A three-dimensional unified singular structure with mixed orientation "upside down & right-side up" architectural elements becomes possible due to a novel process integration that is employed to create the backside power distribution network. The novel structure stops cracks in the mechanically weak materials of the active device layers located in the middle of the stack, and provides mechanical stability to weak materials located in the middle of the stack that are slotted in between tougher stronger "structural dielectric" materials.

In the context of this patent application, "structural dielectric" includes tetraethylorthosilicate (TEOS), fluorinated TEOS (FTEOS), silicon carbide (SiC), silicon nitride (SiN), silicon carbonitride (SiCN), and carbonitride (CN) materials as well as other similarly rigid and tough materials that will be apparent to the skilled worker. Generally, any type of dielectric that is presently used in semiconductor builds, including but not limited to so-called "low-K" dielectrics, can act as a structural dielectric that is tough and strong by comparison to the active device layer.

The via bars 1104, 1106 bridge across and reinforce the mechanically weaker active device layer 202. The via bars 1104, 1106 have larger via bar widths terminating above and below the active device layer 202, which advantageously provides increased metal density and larger metal to metal surface contact at the interface between the via bars 1104, 1106 and their corresponding frontside and backside structures 204, 206. The larger metal to metal surface contact increases adhesive and mechanical strength and robustness. The via bar width at the interface is varied by mixing the via bar orientations, which strengthens the interfaces between via bars and metal lines at each side of the active device layer by providing uniform density of via bar widths in the crack's growth path trajectory.

FIG. 12 depicts a variant crack stop 1200. Structures similar to those of preceding figures are similarly numbered. The mechanical crack stop barrier structure 1200 includes via bars 1204, 1206 of differing vertical locations. The different via bars 1204, 1206 have relocated vulnerable metal to metal contact interfaces to different metal and dielectric levels, so that stress is distributed throughout the structure to mitigate cracking. The via bars 1204, 1206 extend through the active device layer 202 and are larger than traditional single level vias, i.e. each of the via bars 1204, 1206 spans multiple layers in height. The via bars 1204, 1206 create a staggered metal to metal contact interface that distributes stress to different metal and dielectric levels of the integrated circuit structure, i.e., the via bars connect or "land" on various metal planes. For example, via bar 1204 extends through the active device layer 202 from a first layer 1208 of the first or frontside portion 204 to a first layer 1210 of the second or backside portion 206, whereas via bar 1206 extends from a second layer 1212 of the first portion 204 to a second layer 1214 of the backside portion 206. Herein, "first" and "second" are adapted simply to distinguish between multiple layers that are in different locations, and it should be understood that either the second or the first layer of a stack may be at any location within the stack, except as otherwise described. By traversing two or more dielectric layers, with starting points within tougher dielectric materials (TEOS, etc.), and with differing termination or landing points within the overall structure, the via bars 1204, 1206 assist in blocking, diverting, or stopping crack growth and propagation because an impinging crack's growth and propagation that is able to breach one interface will eventually directly encounter a solid piece of metal (e.g., copper). Additionally, anchoring the via bars in tougher dielectric materials above and below the active device layer provides a more robust crack stop design that is mechanically stronger and has stronger adhesive properties (preventing delamination and the films pulling apart at the active device layer).

Figure 13:
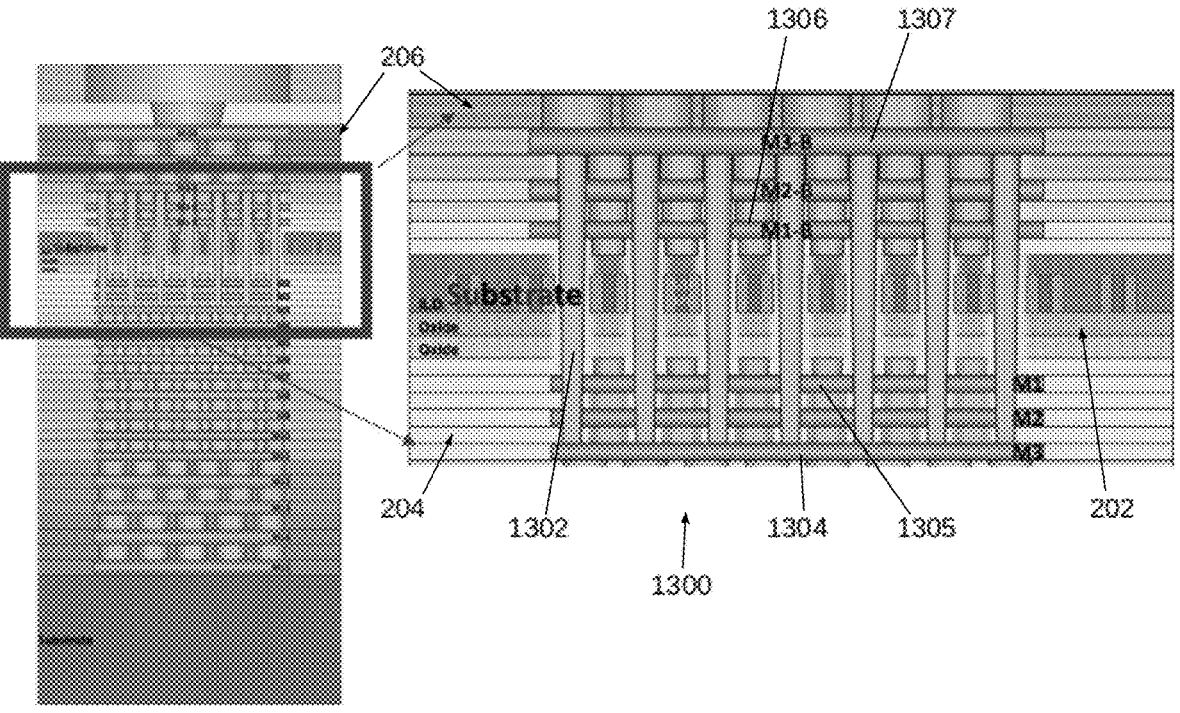
FIG. 13 depicts a variant crack stop, according to exemplary embodiments.

FIG. 13 depicts a variant crack stop 1300, in which via bars 1302 extend from a first layer 1304 of the first portion 204 through another layer 1305 of the first portion 204, then through the active device layer 202 and through a layer 1306 of the second portion 206 to another layer 1307 of the second portion 206. Structures similar to those of preceding figures are similarly numbered.

Figure 22:
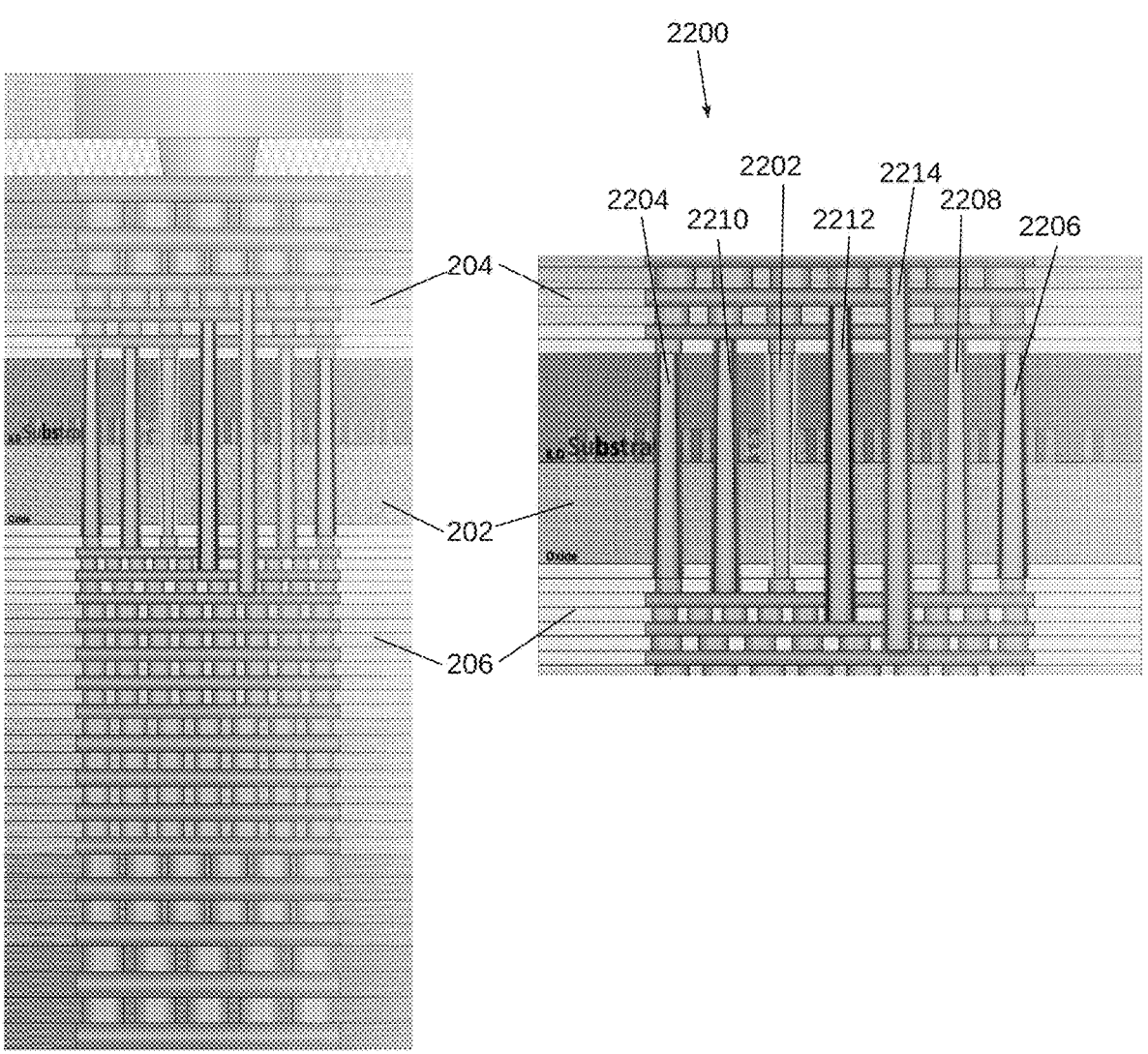
FIG. 22 depicts a variant crack stop structure, according to exemplary embodiments.
Figure 25A:
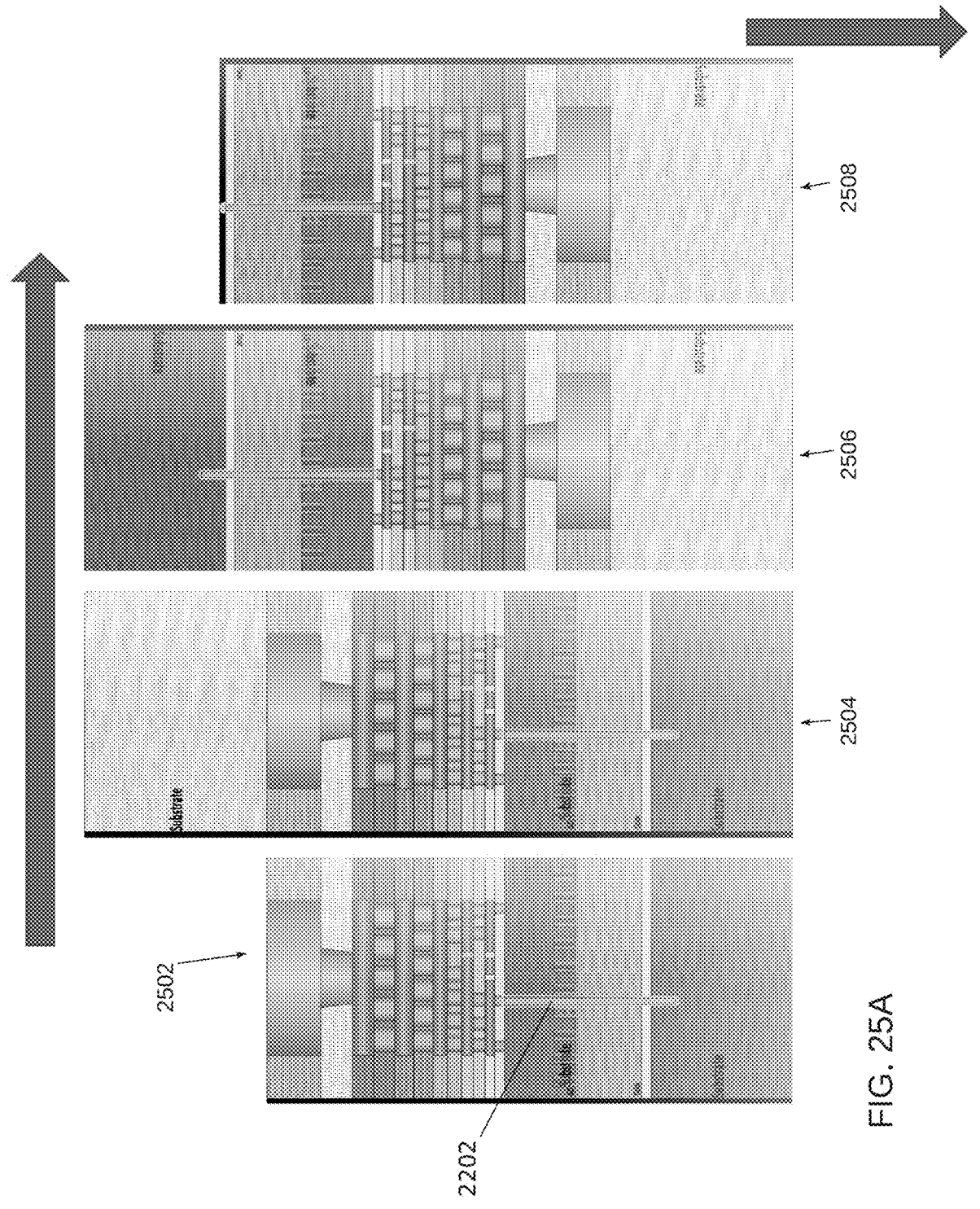
FIGS. 25A and 25B depict a process flow for making a crack stop structure, according to exemplary embodiments.
Figure 25B:
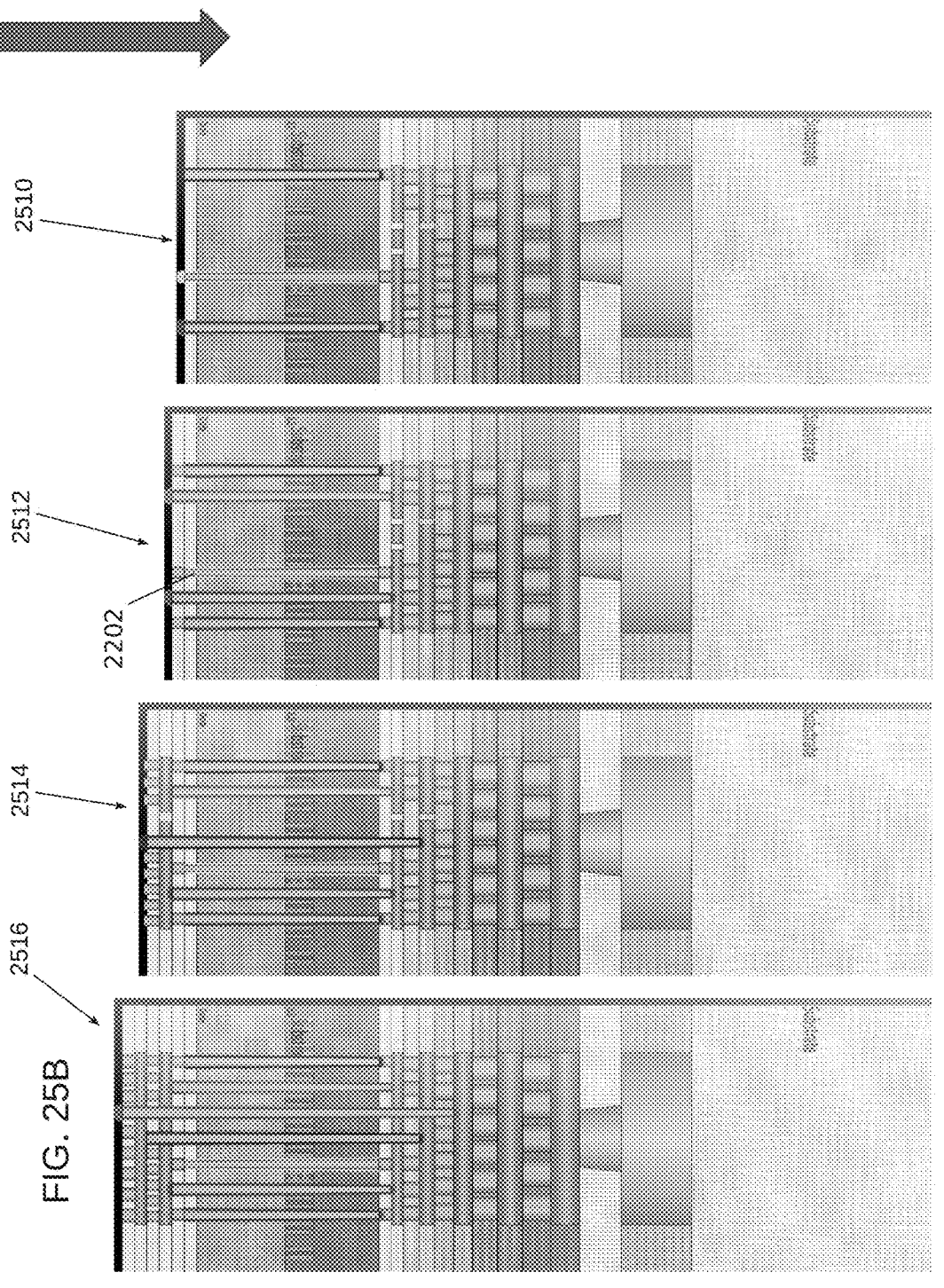

FIG. 22 shows yet another variant crack stop 2200, in which a first via 2202 is fabricated through the active device layer 202 prior to fabrication of the frontside metal layers 204. Then the structure is inverted, and additional vias 2204, 2206, 2208, 2210, 2212, 2214 are formed during fabrication of the backside metal layers 206. FIGS. 25A and 25B, discussed further below, depict a partial process flow diagram for the structure 2200.

The embodiments of FIGS. 1, 11, 12, 13, and 22 can be combined in numerous ways that will be apparent to an ordinary skilled worker in light of the present disclosure.

The Electrostatic Guard Ring

Figure 14:
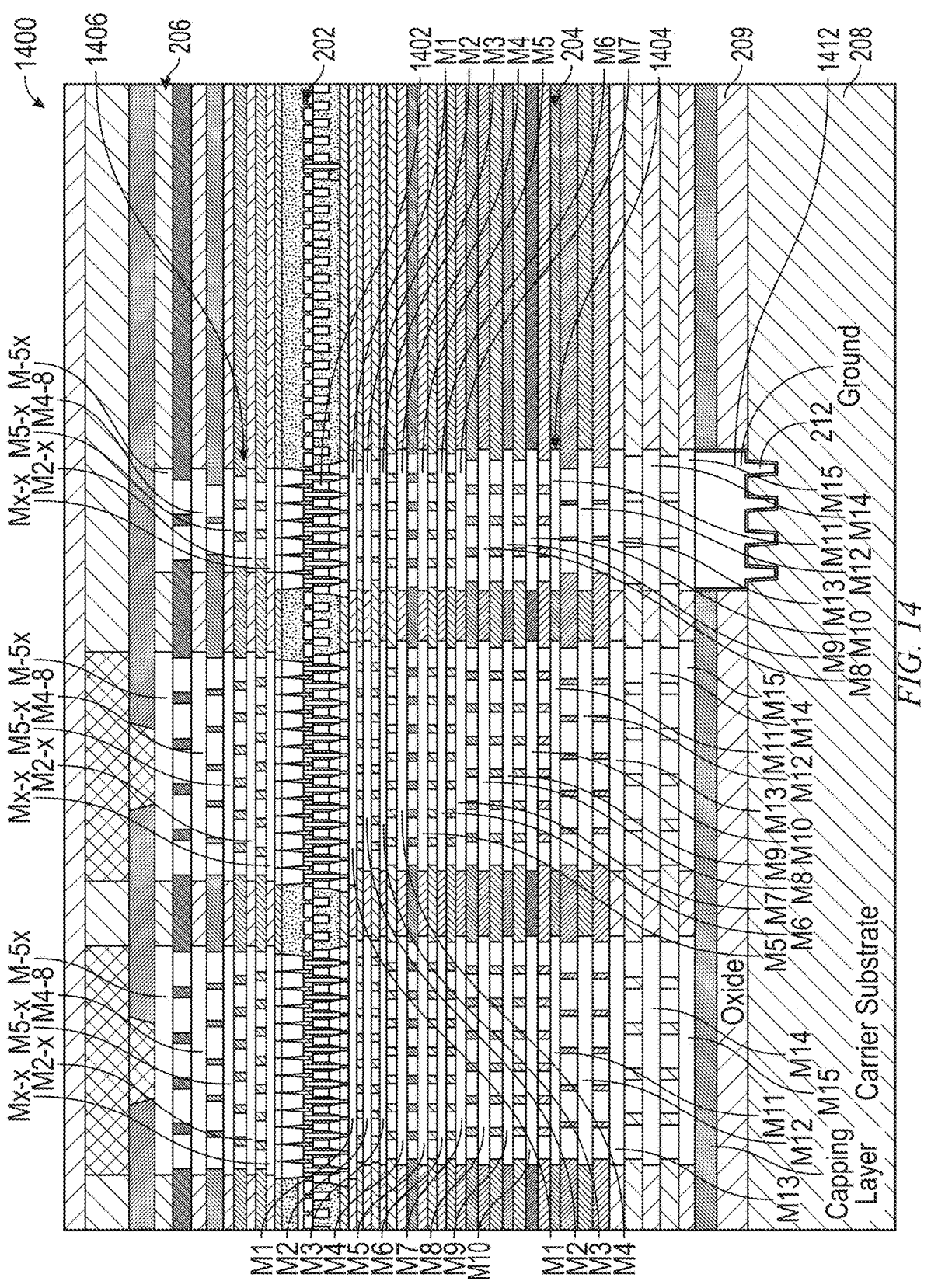
FIG. 14 through FIG. 15 depict an electrostatic guard ring and its fabrication process, according to exemplary embodiments.
Figure 15:
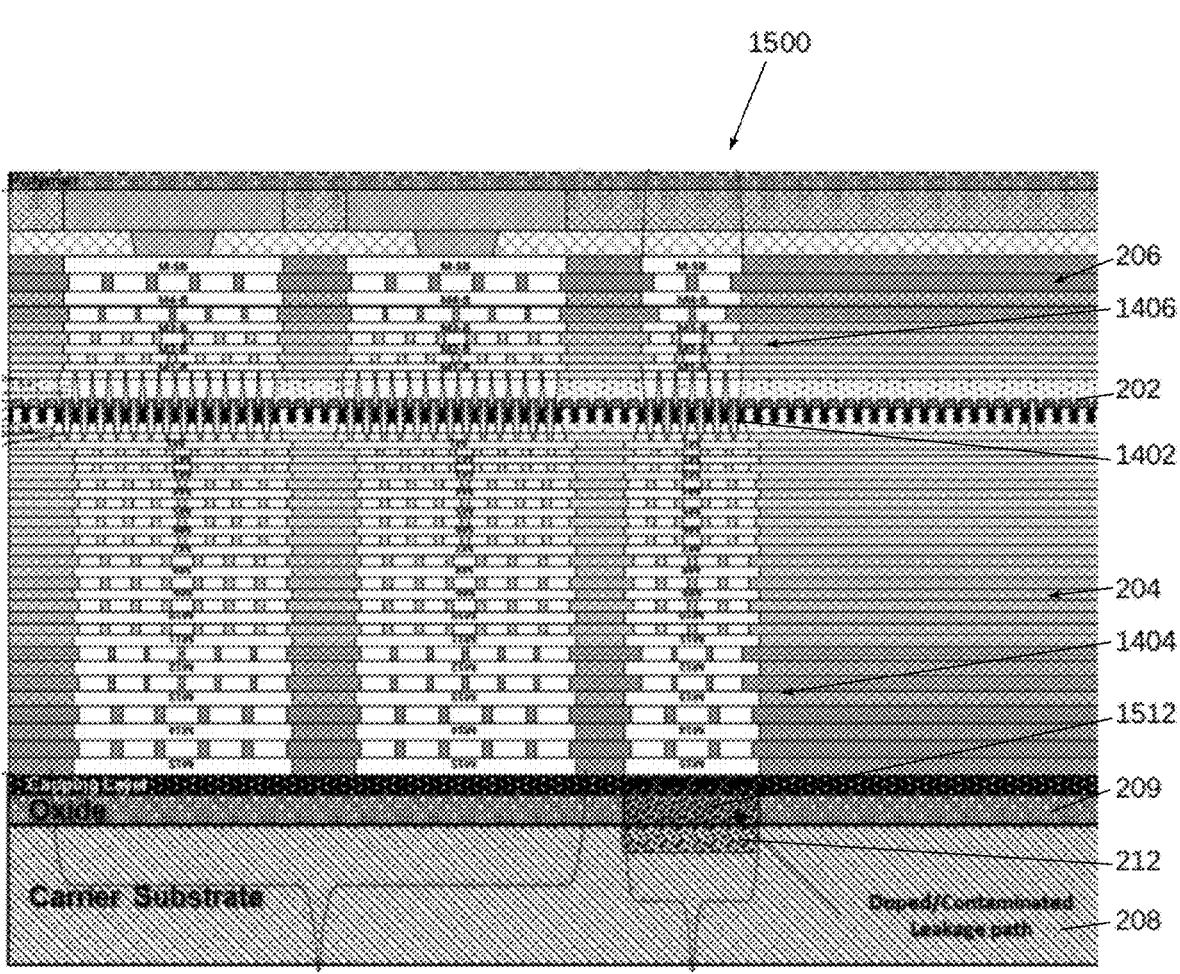

FIG. 14 depicts a side view of a first electrostatic guard ring 1400. FIG. 15 depicts a side view of a second electrostatic guard ring 1400. Structures similar to those of preceding figures are similarly numbered.

In one or more embodiments, the electrostatic guard ring 1400 or 1500 can look very similar to a crack stop but does not necessarily need to be continuous and can have electrical properties. It can also be significantly smaller or have a smaller overall footprint. In one or more embodiments, the guard ring connects and grounds to the semiconductor build's substrate through an active device or trench structure. The guard ring electrically isolates the central active device region of the semiconductor build from neighboring devices due to its structure being grounded to the semiconductor substrate. In one or more embodiments, its primary function is to electrically isolate an active device semiconductor die from neighboring die or semiconductor builds. Its presence assists in mitigating charging and arcing events as well as attracting any present ionic or electrical defects towards its structure and away from the active devices. Either of the guard rings 1400 or 1500 incorporates a frontside structure 1404 in the frontside layers 204 and a backside structure 1406 in the backside layers 206, which are mechanically and electrically connected by a plurality of vias 1402 that penetrate the active device layer 202 so that the guard ring bridges across the active device layer. The frontside structure 1404 is grounded by electrical connections to patterns 212 (shown in FIG. 1) on the carrier wafer 208, so that the guard ring provides electrical protection at the carrier to device region interface. The guard ring is able to dump excess charge collected by the guard ring to a ground (carrier wafer). It also assists in discharging any excess charge accumulating at the interface/junction of the BEOL stack build and the carrier wafer. The guard ring protects the active device layer and the wiring levels which are connected to the device layer. If the bottom wiring layers were left unprotected then charge could be transferred to the device layer through these bottom wiring layers. The guard ring builds an electrical shield. The guard ring can serve many different functions. The carrier wafer patterns 212 can be metallized, irradiated, or doped to enhance conductivity. The patterns 212 could be in the carrier body, or in the adhesion layer 209, or both. If the patterns 212 are in the carrier body, then the guard ring may be electrically connected to the patterns through the adhesion layer by, for example, a metal wire, a doped polysilicon plug, or a thin oxide on the polysilicon of the carrier body. In one or more embodiments, the electrical connection from the guard ring 1400 or 1500 to the carrier patterns 212 is a continuous ring that surrounds the chip. In one or more embodiments, the electrical connections between the guard ring 1400 or 1500 and the carrier patterns 212 are within the interior of the chip. For example, the guard ring 1400 or 1500 may be connected to the carrier patterns 212 by continuous rings that surround the perimeter of individual device regions within the chip.

In the guard ring 1400, the frontside structure or first portion 1404 connects to the carrier patterns 212 by way of a plug 1412. The plug 1412 may be metal or polysilicon. Alternatively, in the guard ring 1500, the frontside structure or first portion 1404 connects to the carrier patterns 212 by way of a region 1512 of semiconductor that is irradiated or doped to be more conductive than surrounding bulk semiconductor.

The electrostatic guard ring 1400 or 1500 can be built according to similar methods as the crack stops 300, 1100, 1200, or 1300.

The Crack Sensor

Figure 16:
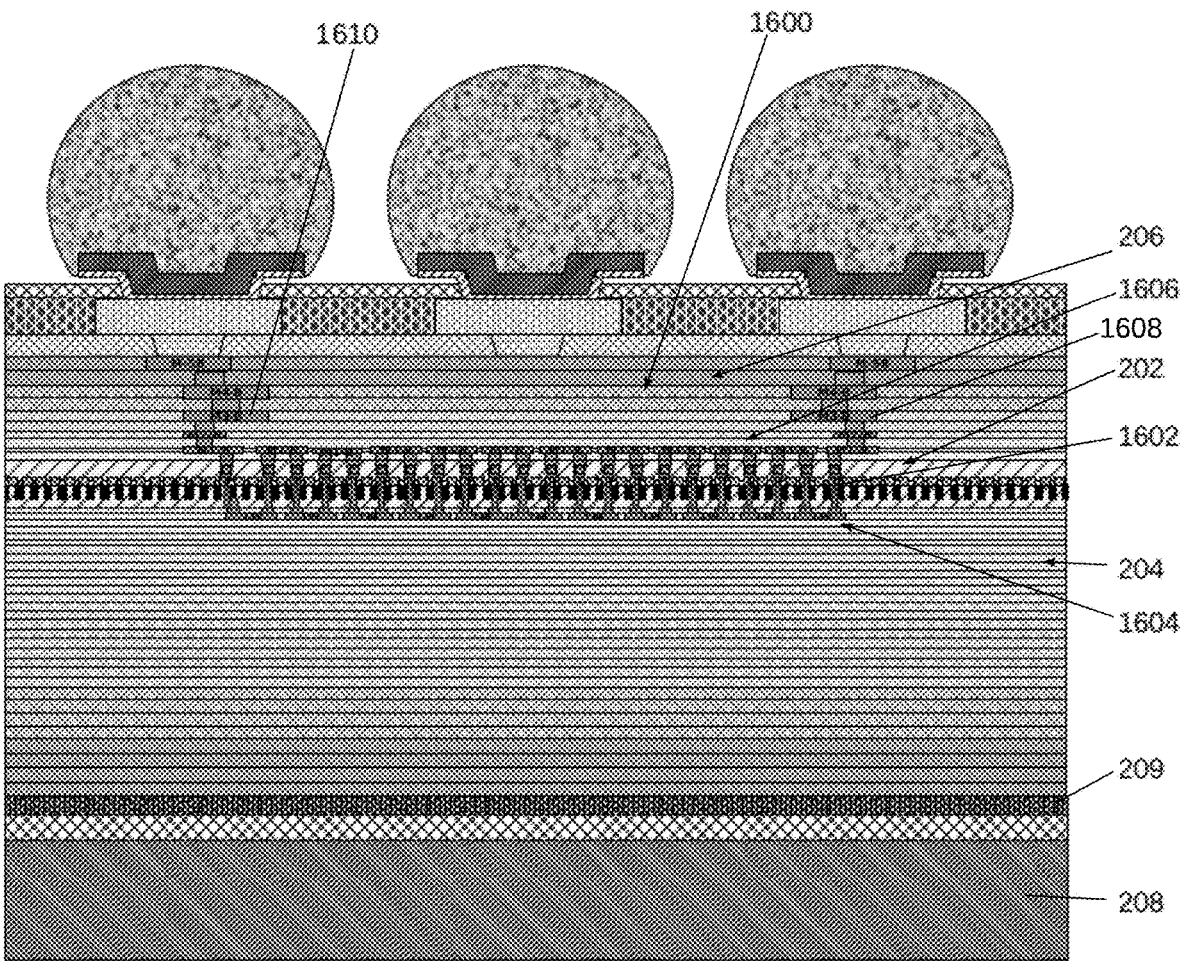
FIG. 16 depicts a crack sensor, according to exemplary embodiments.

FIG. 16 depicts a crack sensor 1600 that comprises first metal line segments 1604, second metal line segments 1606, and vias 1602 that stitch the segments together, creating an electrically conductive path between a first sense pad 1608 and a second sense pad 1610. Structures similar to those of the preceding figures are similarly numbered. This structure includes daisy chain links of metal (stitches) that jog up and down a semiconductor's dielectric stack (e.g., 204, 206), creating a stitch-like structure. In one embodiment, the first metal line segments 1604 are in the frontside structure 204 and the second metal line segments 1606 are in the backside structure 206. The sensor 1600 is typically placed at or near the edge or perimeter of a semiconductor die build so that it can detect a crack breach from the edge before it gets too deep into the build. This placement is trying to capture/sense a crack breach as early as possible. Therefore, it can be called a perimeter-line or "p-line stitch." It can be used to detect the presence of a crack breach that was able to circumvent the crack stop structure. It also can be used to detect delamination events. If a crack or delamination were to occur within the active prime region; the p-line stitch structure would 'break' and the links of the structure would be discontinuous or separated. This break in the chain can be detected through electrical resistance measurements. Furthermore, if designed properly the specific location of the break can be determined through correlating which link(s) of the structure has been separated. Given the teachings herein, the skilled artisan would understand how to design it properly to give specific location of a crack through measuring which links of the structure have been broken. Typically, the p-line stitch is not connected to any electrical devices and therefore has no inherent electrical properties and is a passive structure. The segments and vias of the p-line stitch are arranged in such a way (i.e., series, parallel, or series-parallel) that breaking one of the vias would reduce the electrical connectivity of the p-line stitch between the sense pads. In one or more embodiments, the p-line stitch is configured in such a way (i.e., series) that breaking one of the vias would break the electrical connectivity of the p-line stitch between the sense pads. The p-line stitch has not previously been applied across the active device layer in builds in which the active device layer 202 is located between frontside dielectrics 204 and backside dielectrics 206.

Figure 17:
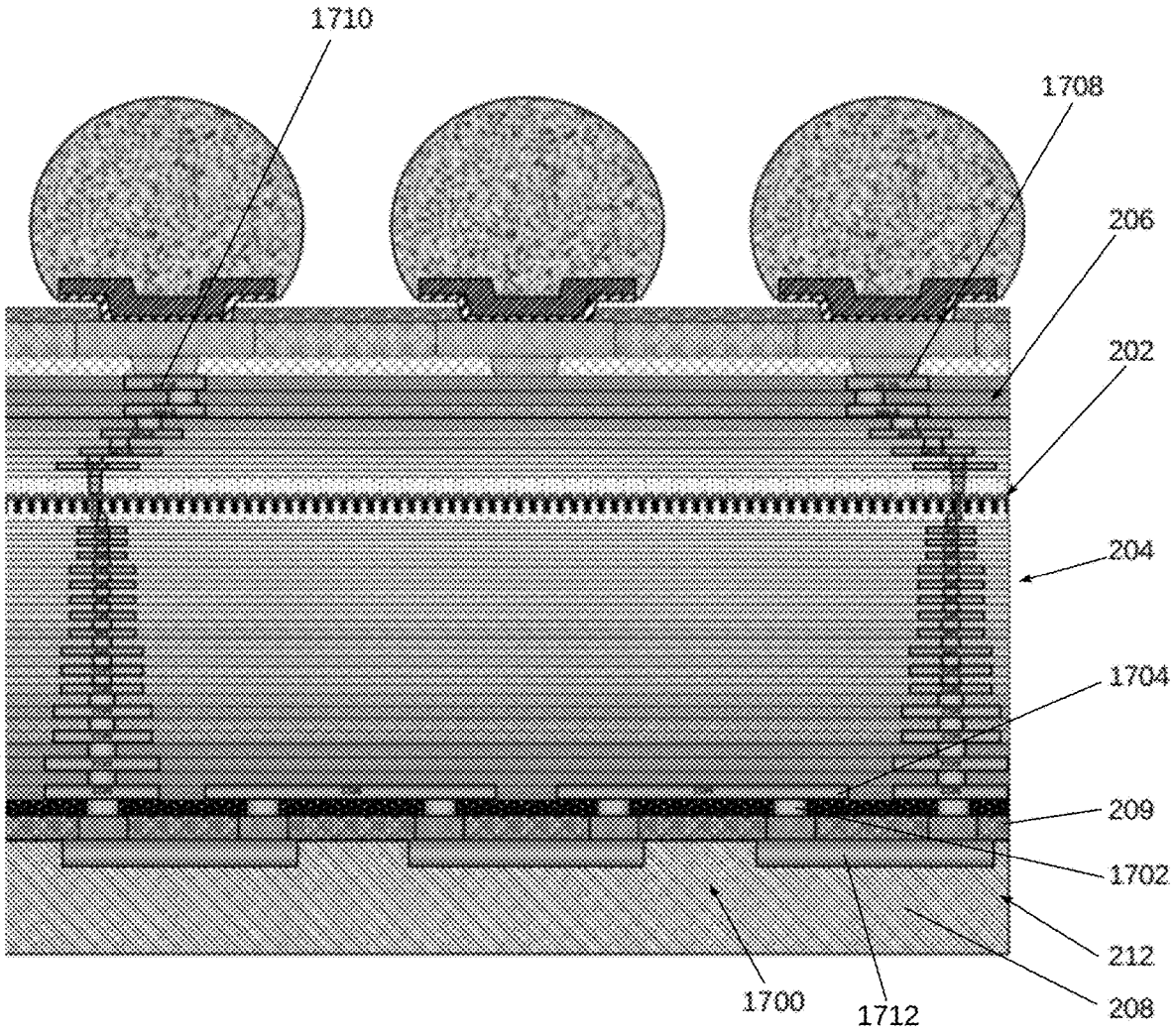
FIG. 17 depicts a crack sensor, according to exemplary embodiments.

FIG. 17 depicts another crack sensor 1700, which has a plurality of first metal line segments 1704 that are connected by "vias" 1702 to a conductive pattern 212 that is formed in the substrate 208 or in the adhesion layer or in both. Structures similar to those of preceding figures are similarly numbered. The conductive pattern 212 comprises a plurality of second line segments 1712. The first metal line segments 1704 are disposed in the frontside structure 204 and the vias 1702 penetrate a bonding layer 209 that is formed between the substrate 208 and the frontside structure 204. The "vias" 1702 may be at least one of metal wires, doped semiconductor regions, or thinned portions of the dielectric bonding layer 209. A crack that propagates through the bonding layer will disrupt conductivity of any of these types of "vias." Thus, a crack or delamination in the bonding layer will interrupt electrical connectivity between a first sense pad 1708 and a second sense pad 1710 through the crack sensor 1700.

Figure 18:
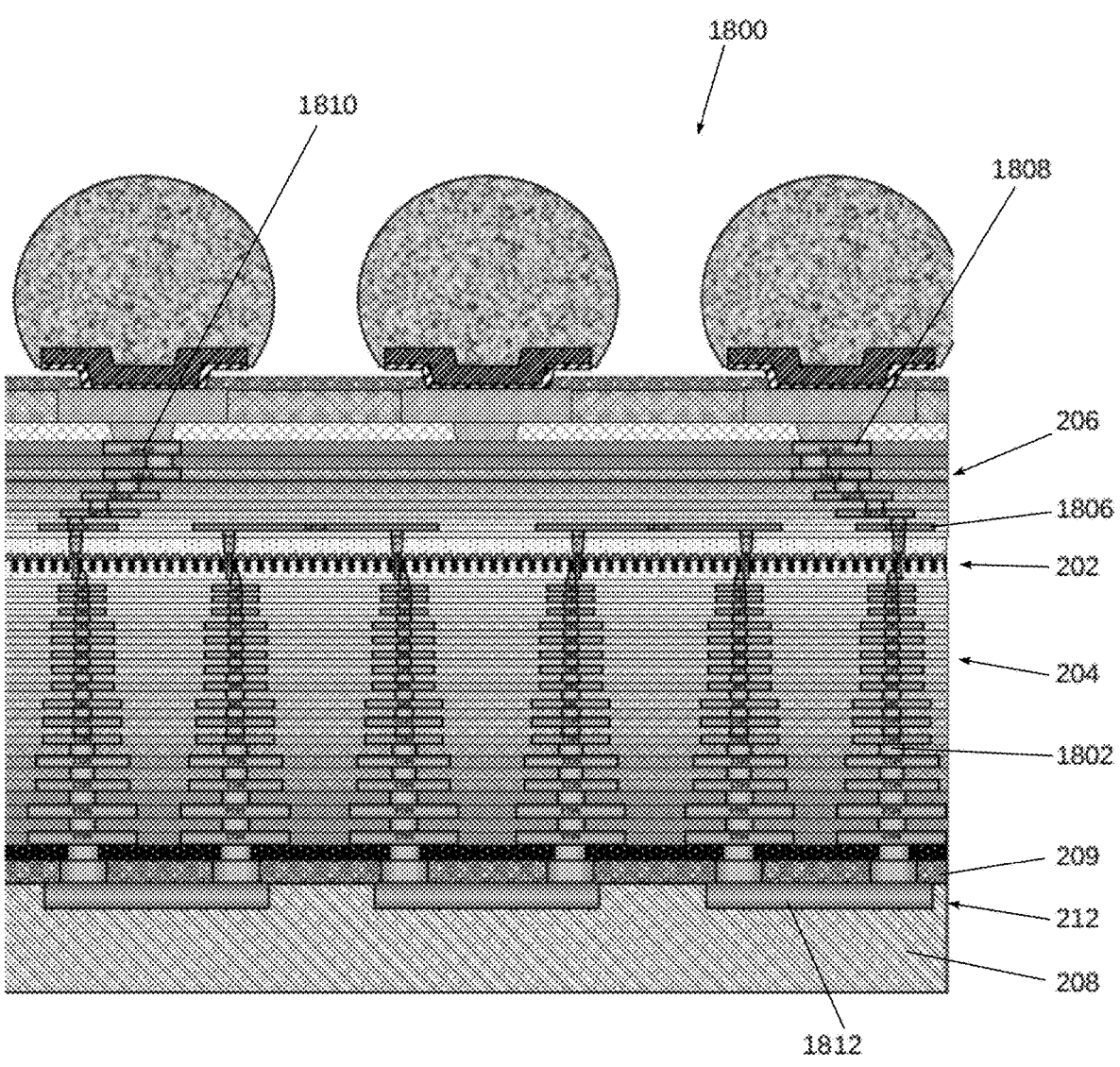
FIG. 18 depicts a crack sensor, according to exemplary embodiments.

FIG. 18 depicts another crack sensor 1800, which electrically connects a first sense pad 1810 to a second sense pad 1808. Structures similar to those of preceding figures are similarly numbered. The crack sensor 1800 has a plurality of first metal line segments 1806 that are disposed in the backside structure 206. The first metal line segments 1806 are connected by vias 1802 to a conductive pattern 212 that is formed in the substrate 208 or in the adhesion layer or in both. The conductive pattern 212 comprises a plurality of second line segments 1812.

The Moisture Sensor

Figure 19:
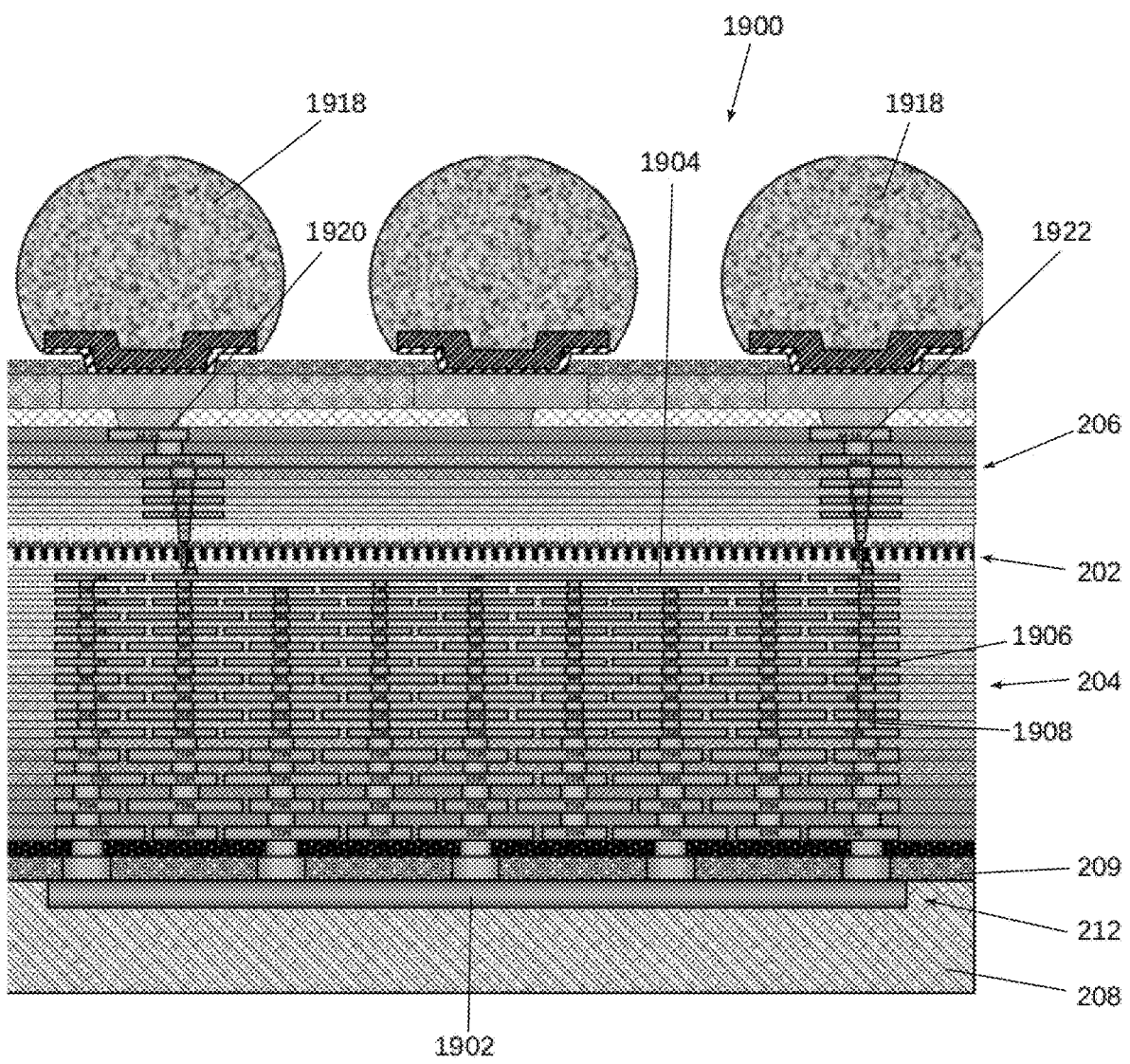
FIG. 19 depicts a moisture sensor, according to exemplary embodiments.

FIG. 19 depicts a moisture sensor 1900, which comprises two interlocking structures 1902, 1904 that include metal plates, lines, or wires 1906 and vias 1908 that extend vertically in the wiring layers of the stack. Structures similar to those of preceding figures are similarly numbered. The two structures 1902, 1904 are not continuous with each other: although they comprise interlocking metallic lines, the structures are isolated from each other by dielectric; thus, they form a capacitor. Accordingly, the moisture sensor 1900 supports measurement of capacitance within the stack and/or interface between carrier and device region. Capacitance is measured between the interlocking metallic portions 1902, 1904. Moisture breaching into the dielectric material between the interlocking metal features results in measurable capacitive changes and indicates the presence of water.

In one or more embodiments, each of the structures 1902, 1904 includes a plurality of vias 1908 with horizontally-extending fingers 1906 protruding from the vias of each structure toward the vias of the other structure so that the fingers of the two structures are interleaved/interlocked with each other.

In one or more embodiments, the moisture sensor 1900 is located inside an active prime region of a chip. In one or more embodiments, the moisture sensor 1900 is located outside of an active prime region in a kerf/frame/dicing channel portion of a wafer. In one or more embodiments, the moisture sensor 1900 is disposed in at least one of the substrate, the frontside structure 204, the active device layer 202, or the backside structure 206. In one or more embodiments, the moisture sensor 1900 is disposed in at least two of substrate, frontside structure, active device layer, and/or backside structure. The moisture sensor 1900 can be electrically tested from bump pads or bumps 1918 that are electrically connected to a first sense pad 1920 and a second sense pad 1922.

Figure 20:
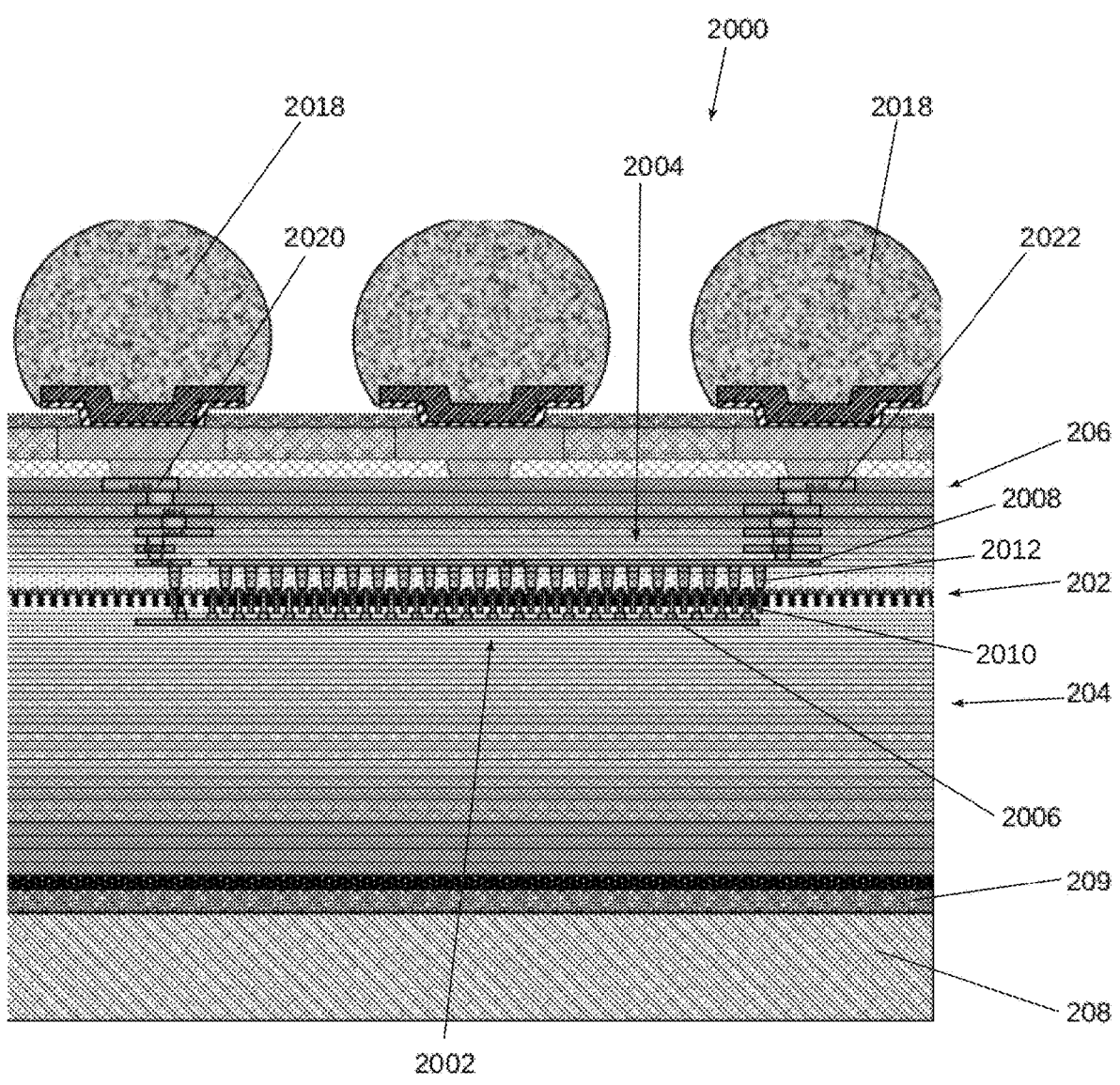
FIG. 20 depicts a moisture sensor, according to exemplary embodiments.

FIG. 20 depicts a moisture sensor 2000, in which a first structure 2002 interlocks with a second structure 2004. Each structure includes a metal line (respectively 2006, 2008) and a plurality of vias (respectively, 2010, 2012) that extend into or even through the active device layer 202. The vias 2010, 2012 are interlocked with each other, but electrically isolated from each other by other structures in the active device layer, e.g., interlayer dielectric. As in the moisture sensor

1900, the structures 2002, 2004 form a capacitor and presence of water/moisture in the active device layer will alter the capacitance of the moisture sensor 2000 so that the water intrusion can be detected. The moisture sensor 2000 can be electrically tested from bump pads or bumps 2018 that are electrically connected to a first sense pad 2020 and a second sense pad 2022.

Sensor Locations

Figure 28:
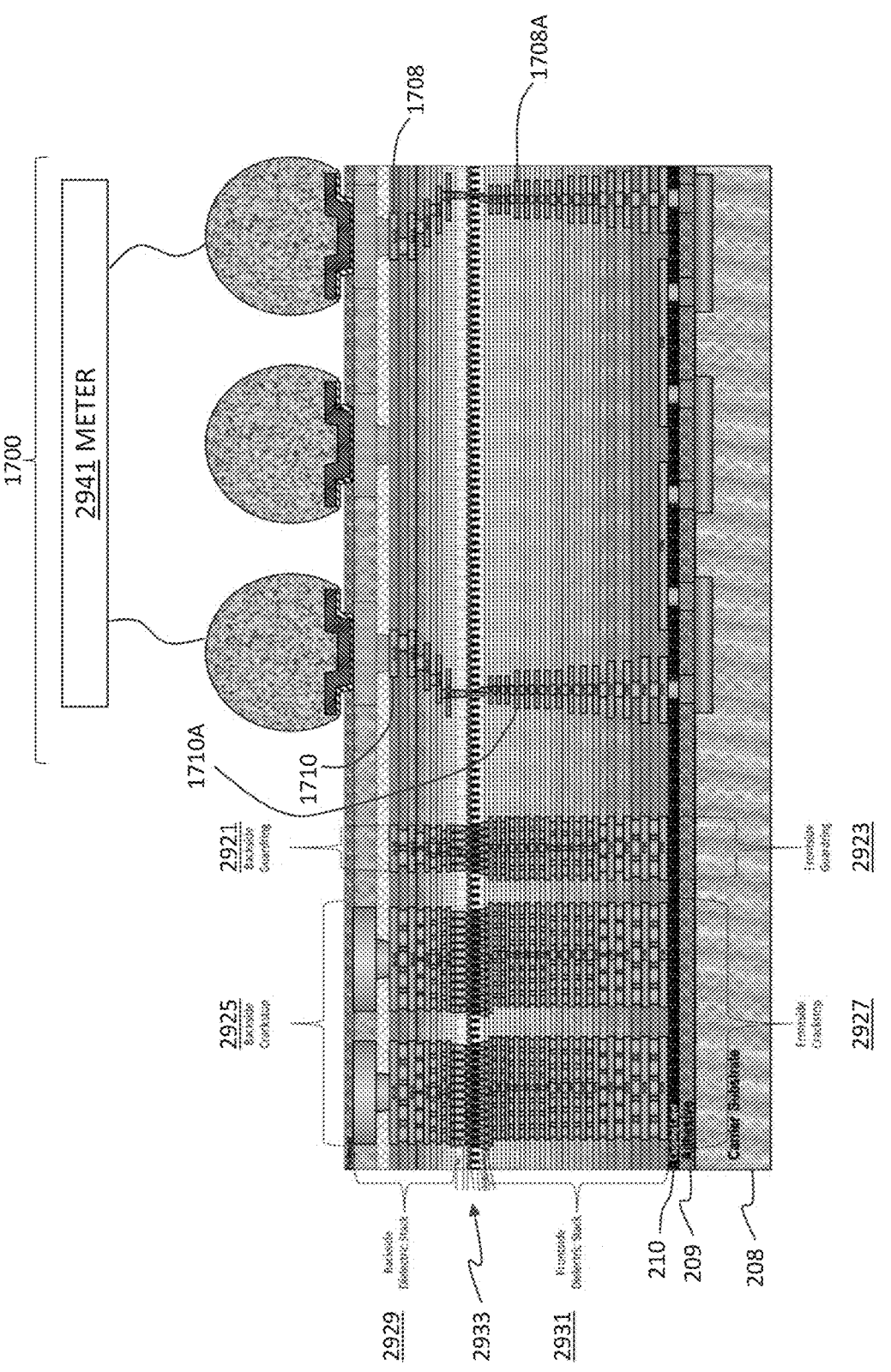
FIG. 28 shows additional sensor embodiments according to aspects of the invention.

Referring to FIG. 28, the right-hand side shows crack sensor 1700 while the left side of the figure shows a guard ring with backside and frontside portions 2921, 2923; a crackstop with backside and frontside portions 2925, 2927; and backside and frontside dielectric stacks 2929, 2931 (extending over the whole figure). Both moisture and crack sensors can be located in many different locations: substrate (bonded interface) as per 208-209-210; backside BEOL 2929; device layer 2933; and frontside BEOL 2931. One or more embodiments can advantageously be used for advanced device layers (<100 nm contacted gate pitch) and/or advanced BEOL layers (<50 nm pitch). Sensors can be placed in multiple locations on the same chip. Intermediate test-points can be used (i.e., temporarily exposed for testing during manufacturing). For example, as noted, a crack or delamination in the bonding layer will interrupt electrical connectivity between a first sense pad 1708 and a second sense pad 1710 through the crack sensor 1700. Sense pads 1708, 1710 are accessible in the final product through the corresponding solder bumps (not separately numbered). However, intermediate testing could be carried out during fabrication at pads 1708A, 1710A (generally indicative of both crack and moisture sensing). Similarly, note meter 2941, generally representative of a continuity sensor or capacitance sensor. During fabrication, meter 2941 could be connected to intermediate pads with suitable probes or the like.

The Fill Structure

Figure 21A:
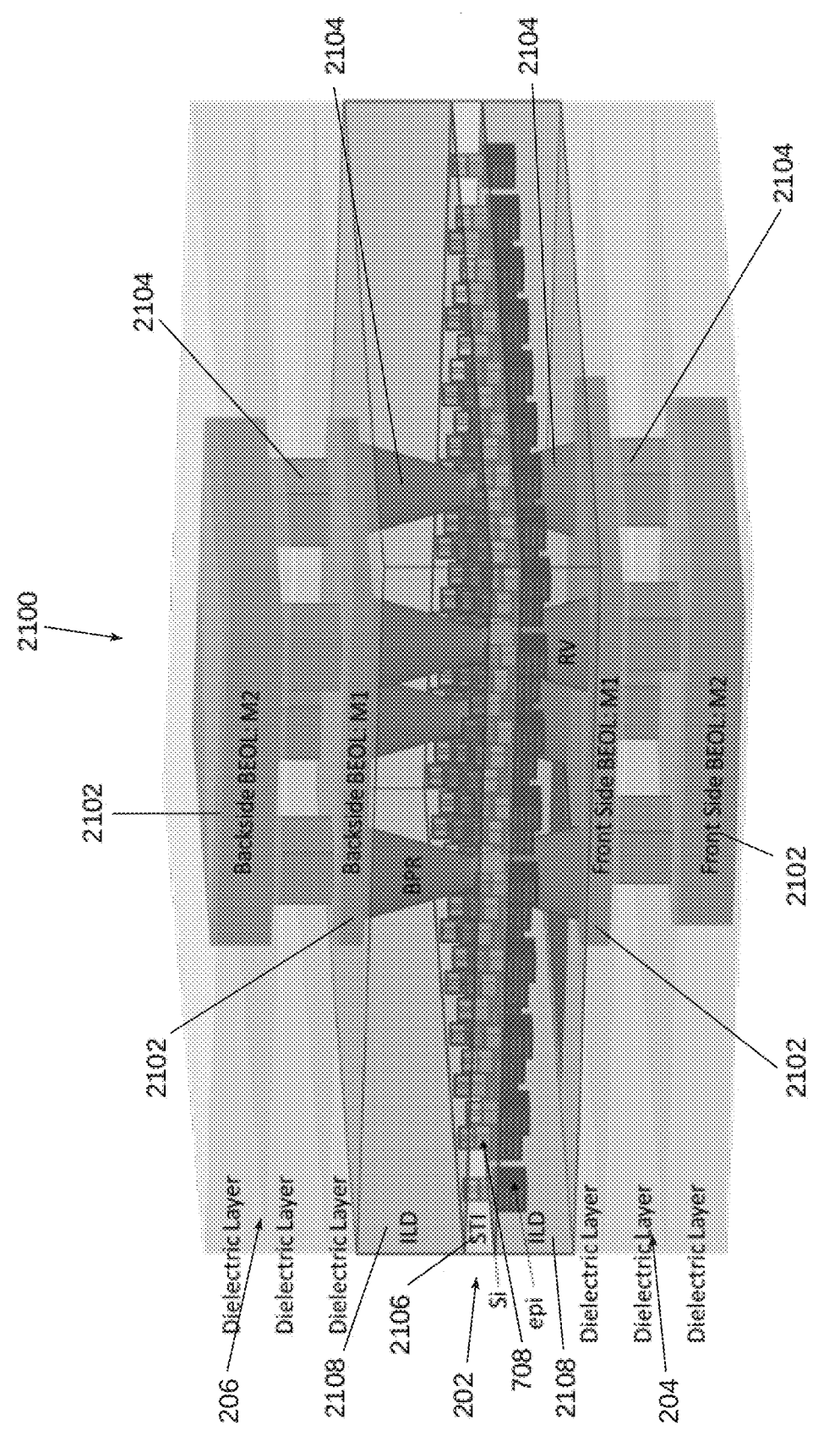
FIG. 21A depicts a fill structure (e.g., three-dimensional or 3D), according to exemplary embodiments.

FIG. 21A depicts a fill structure 2100 (e.g., 3D), which is a structure of metal lines/plates 2102 and vias 2104 that are aligned and stacked together creating a mechanically robust three dimensional structure. In one or more embodiments the fill structure 2100 incorporates discrete rectangular plates and pillar-type vias as shown in FIG. 21A, whereas in other embodiments the fill structure 2100 could have a fishnet design of interlinked metal lines connected by via bars, similar to the crack stop 300. The fill structure 2100 is built above and beneath and bridges across the active device layer 202, which includes shallow trench isolation 2106, interlayer dielectric 2108, and (optionally) active devices 708 between the vias 2104. The structure 2100 is mirrored across the active device region/layer. The structure 2100 can extend to varying levels of the dielectric stack and is centered around the active device layer 202 (in one or more embodiments, the fill structure 2100 occupies three to ten layers in the stack, with two to five metal layers and one to five intervening via layers). The plates 2102 are anchored into structural dielectric layers 204, 206 while the vias 2104 "bolt" together the layers either side of the active device layer 202. In one or more embodiments, fill structures are placed in empty 'white space' regions to assist in processing uniformity (metallization, CMP, etc.) and to increase the build's mechanical robustness and rigidity. The fill structure is a relatively small and discrete body, on the scale of tens to thousands of nanometers, numbering in hundreds to tens of thousands scattered across a chip.

Figure 21B:
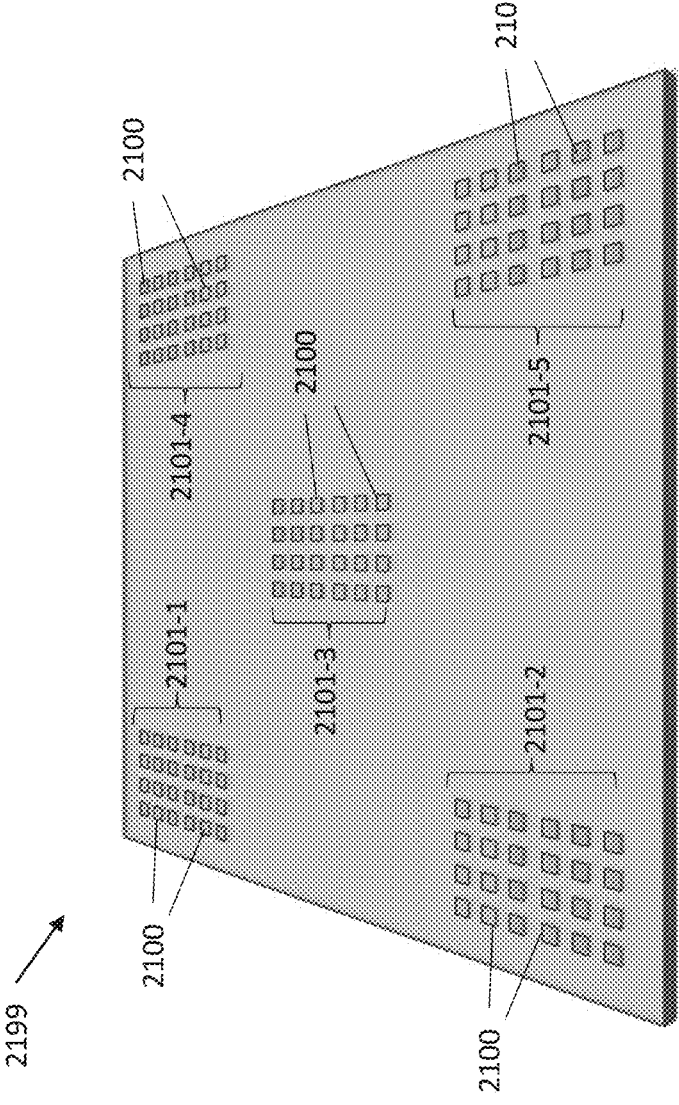
FIG. 21B depicts additional aspects of a fill structure (e.g., three-dimensional or 3D), according to exemplary embodiments.

FIG. 21B accordingly shows a plurality of structures 2100 grouped into groups 2101-1, 2101-2, 2101-3, 2101-4, 2101-5 in a semiconductor structure 2199.

It will accordingly be appreciated that semiconductor fill, in general, is quite pertinent in semiconductor processing and device manufacturing to ensure uniform processing and construction. One or more embodiments advantageously provide a novel fill structure that can be leveraged to: 1. Increase mechanical stability/rigidity of weak materials and layers located in middle and in-between tougher/stronger BEOL dielectric layers; and/or 2. Prevent delamination/ peeling apart of this weaker nanosheet layer region. Nanosheet BSPDN device construction will generally use traditional fill. But the introduction of this mechanically weak region introduces into the BEOL chip-package inter-action (CPI) related vulnerabilities, which can advanta-geously be overcome with mechanical enhancement in accordance with aspects of the invention.

Figure 29:
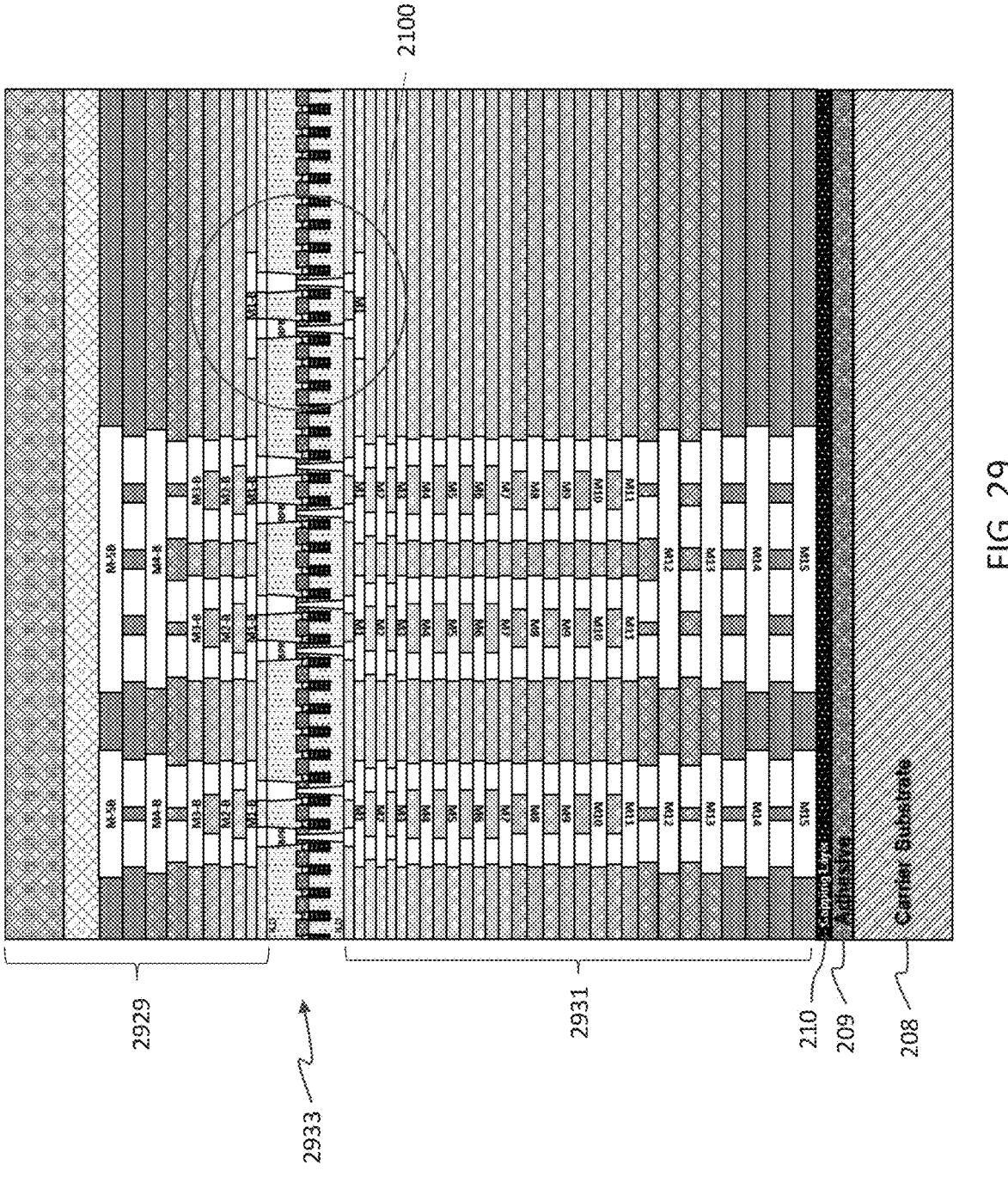
FIG. 29 depicts a fill structure (e.g., three-dimensional or 3D), according to exemplary embodiments.

FIG. 29 shows additional aspects of such a fill structure or staple, in accordance with an exemplary embodiment. The structure 2100 here holds the tougher dielectrics down encasing the weaker nanosheet (device) region.

Figure 30:
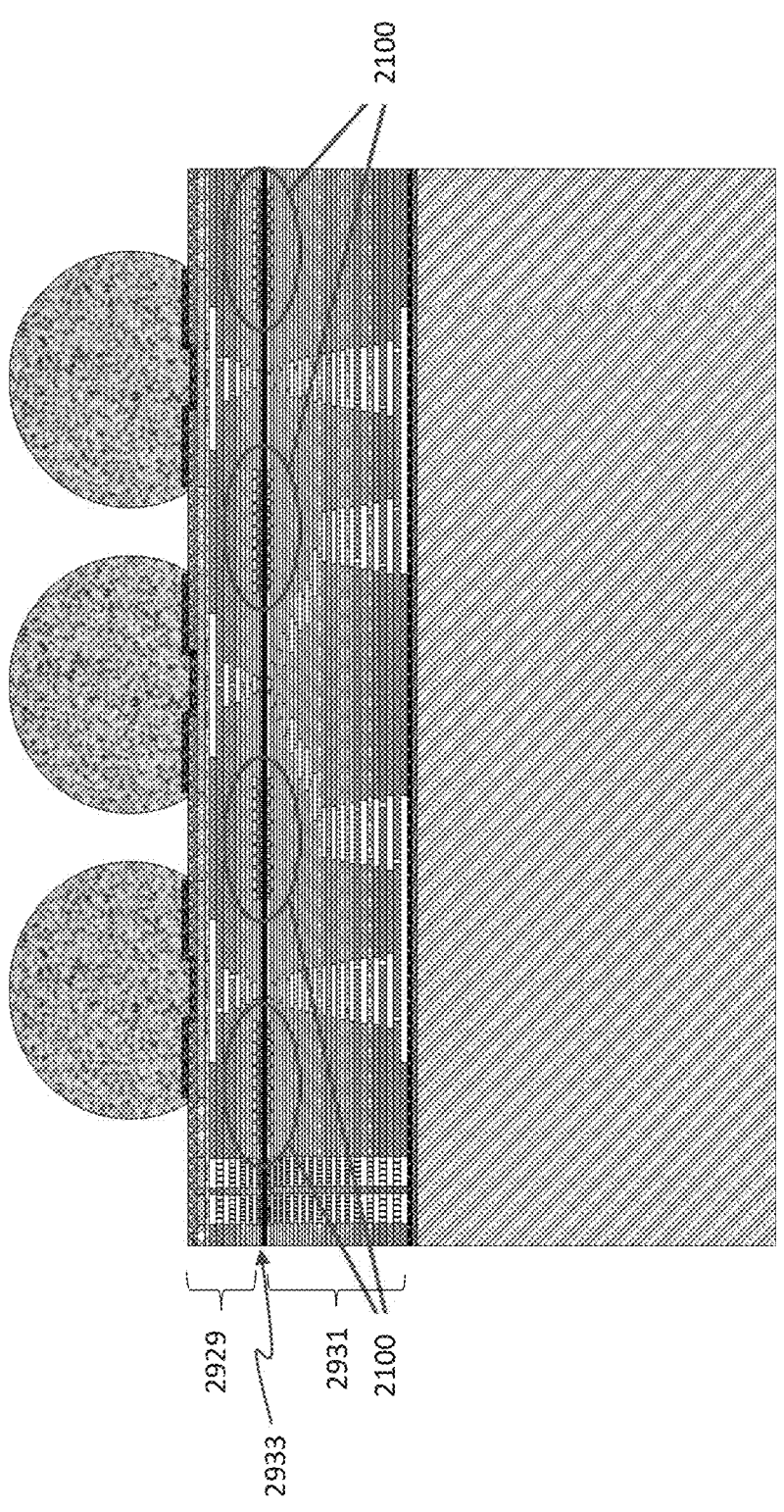
FIG. 30 depicts multiple fill structures (e.g., three-dimensional or 3D), according to exemplary embodiments.

FIG. 30 shows further aspects of such a fill structure or staple, in accordance with an exemplary embodiment. The fill structures 2100 here act as bolting/brackets/struts/ staples, resisting shear stress, tensile stress, and bending stress, effectively acting like a spring to clamp the layers together.

Figure 31:
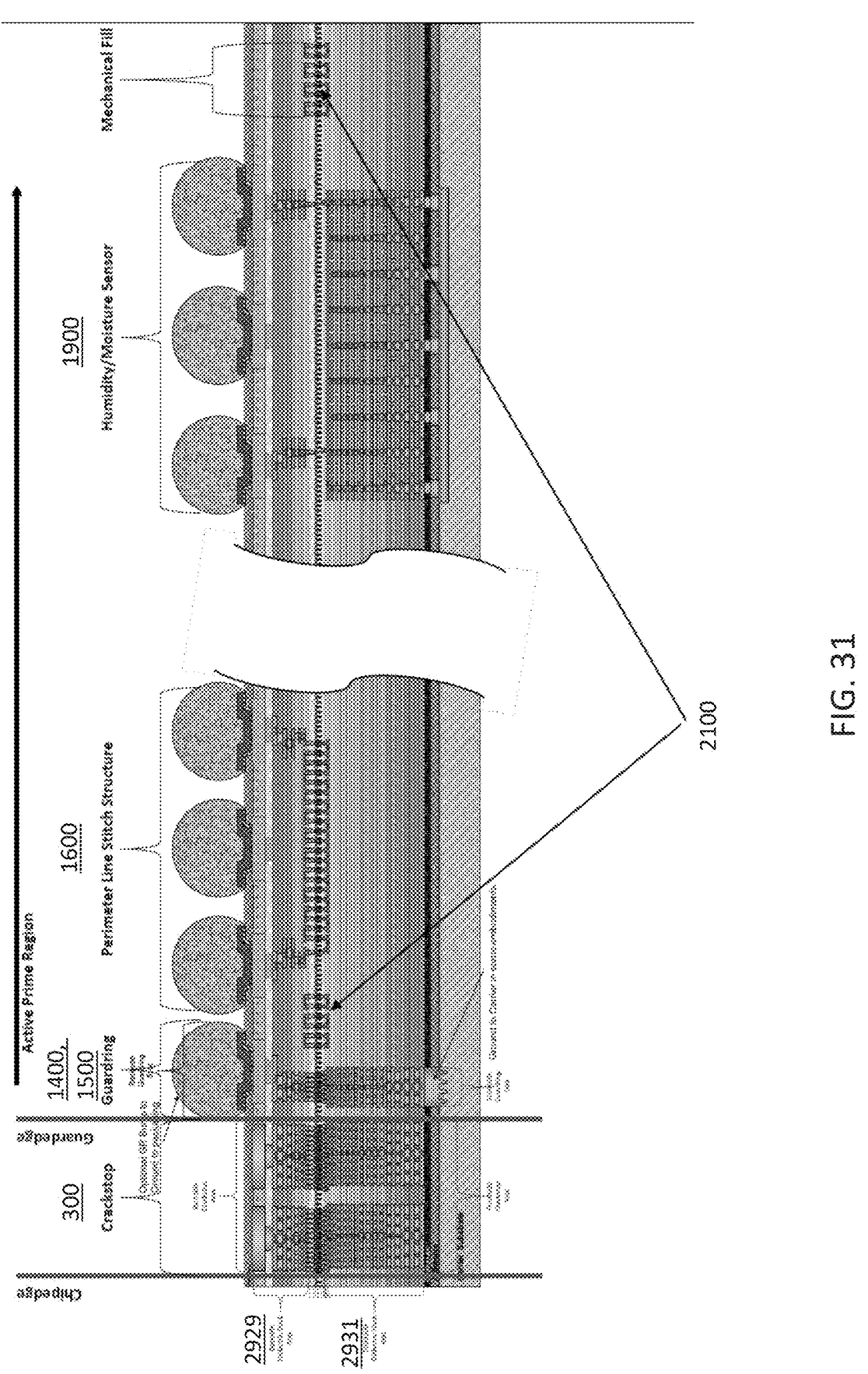
FIG. 31 depicts multiple fill structures (e.g., three-dimensional or 3D), integrated with other inventive aspects, according to exemplary embodiments.

FIG. 31 shows exemplary fill structures 2100 integrated with various inventive aspects as discussed elsewhere herein.

FIGS. 32A-32J show an exemplary sequence of manu-facturing steps for a semiconductor structure with nanosheet transistors, BSPDN, and fill structures according to aspect of the invention. Other than the addition of the fill structures, the skilled artisan will be familiar with the fabrication of nanosheet transistor structures, including steps such as, in no particular order, for example, preparation (deposition/pat-terning) of nanosheet stacks with sacrificial SiGe regions, etch-back of sacrificial SiGe, formation of shallow trench isolation (STI), dummy gates including gate spacers, inner spacers, and BDI, dummy gate open, dummy gate removal, channel release, HKMG stack deposition, self-aligned con-tact (SAC) cap and trench metal contact formation, and with lithography, masks, and patterning, generally. The skilled artisan will be familiar with the "dummy gate" process for forming HKMGs. More generally, the skilled artisan will be familiar with epitaxial growth, self-aligned contact forma-tion, formation of high-K metal gates, and so on. The term "high-K" has a definite meaning to the skilled artisan in the context of high-K metal gate (HKMG) stacks, and is not a mere relative term. The skilled artisan is further familiar with the formation of power rails, wiring networks, and the like.

Figures 32A, 32B, 32C:
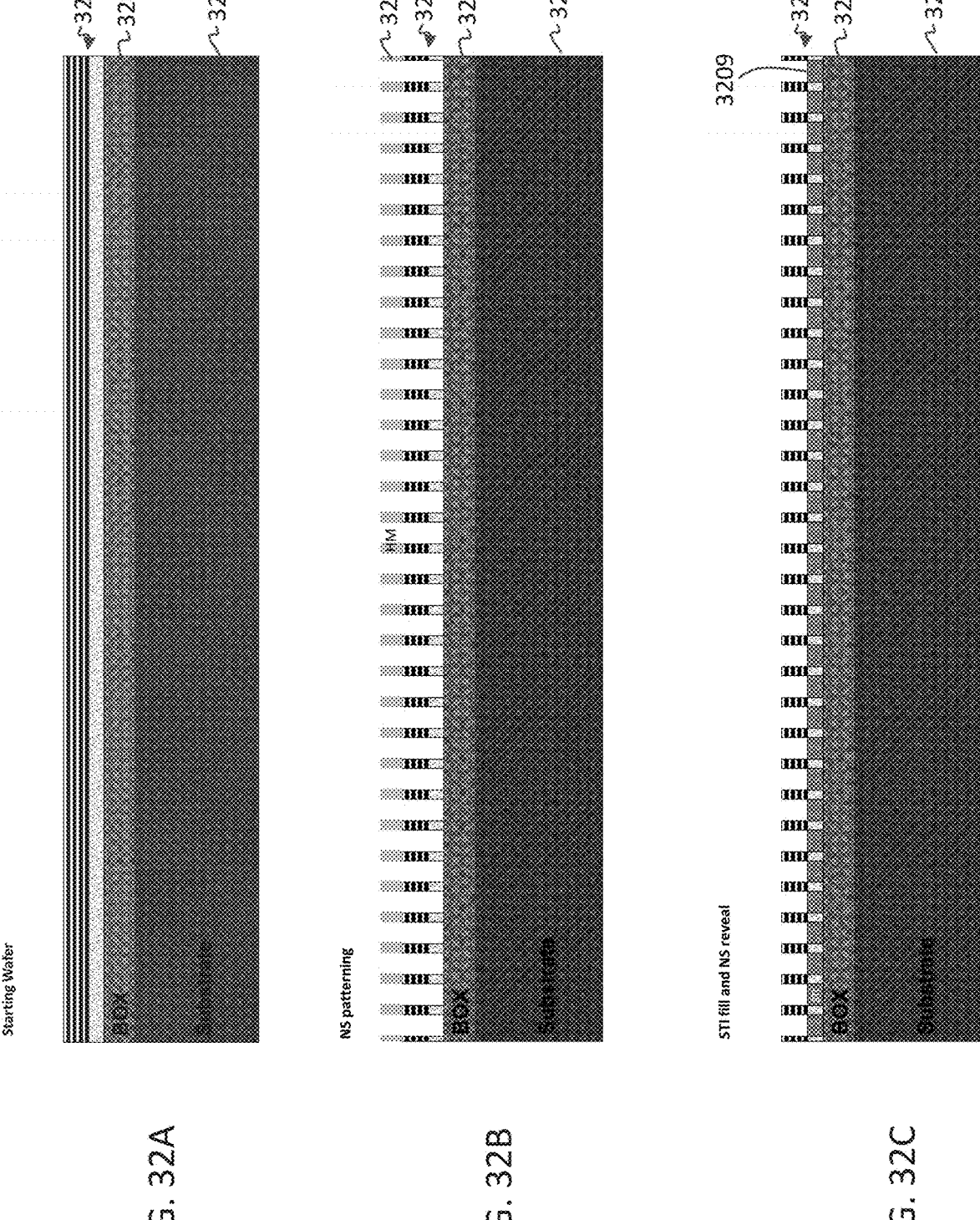
FIGS. 32A-32J depict exemplary steps in fabricating the structure of FIG. 29, according to exemplary embodiments.
Figures 32D, 32E, 32F:
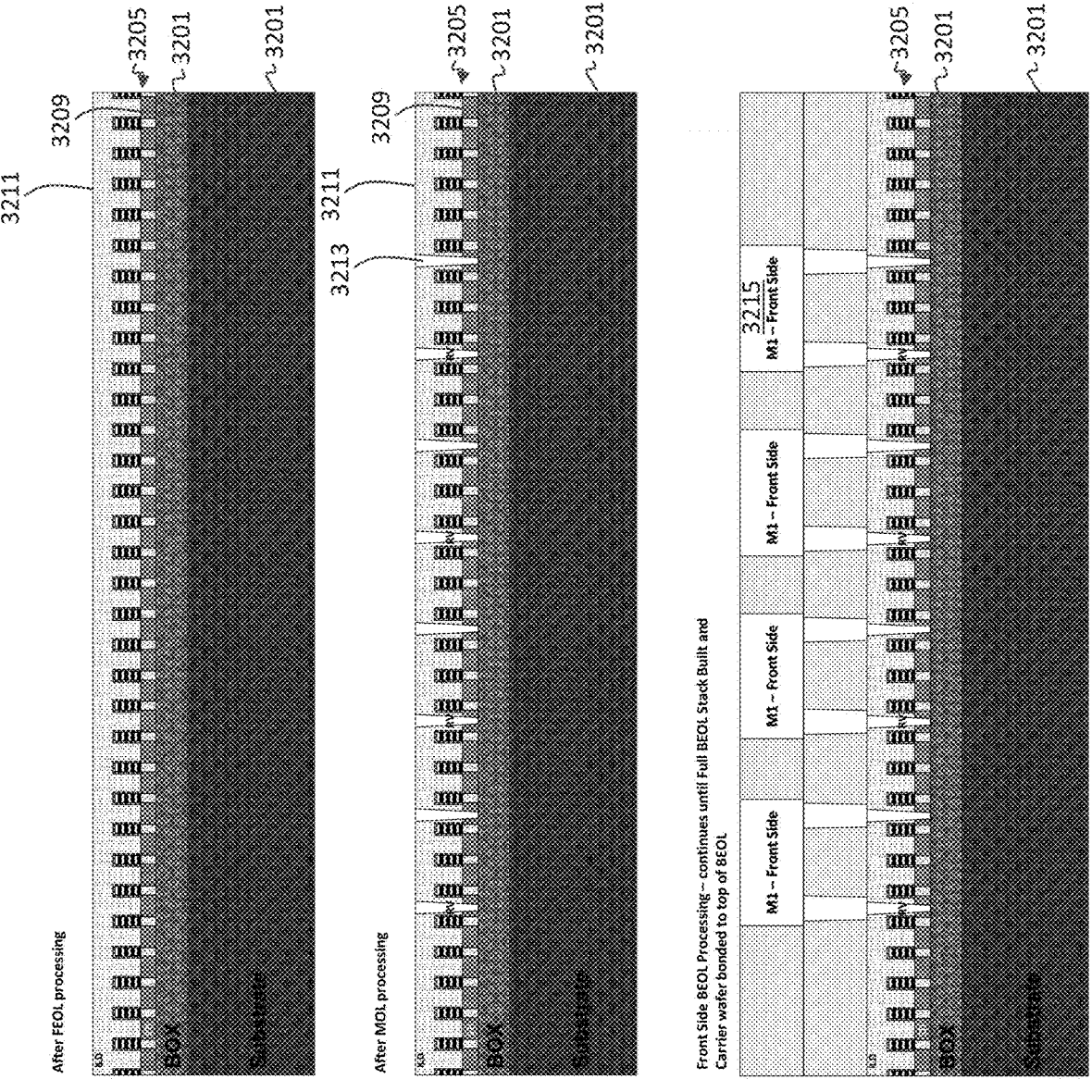
Figures 32G, 32H, 32I:
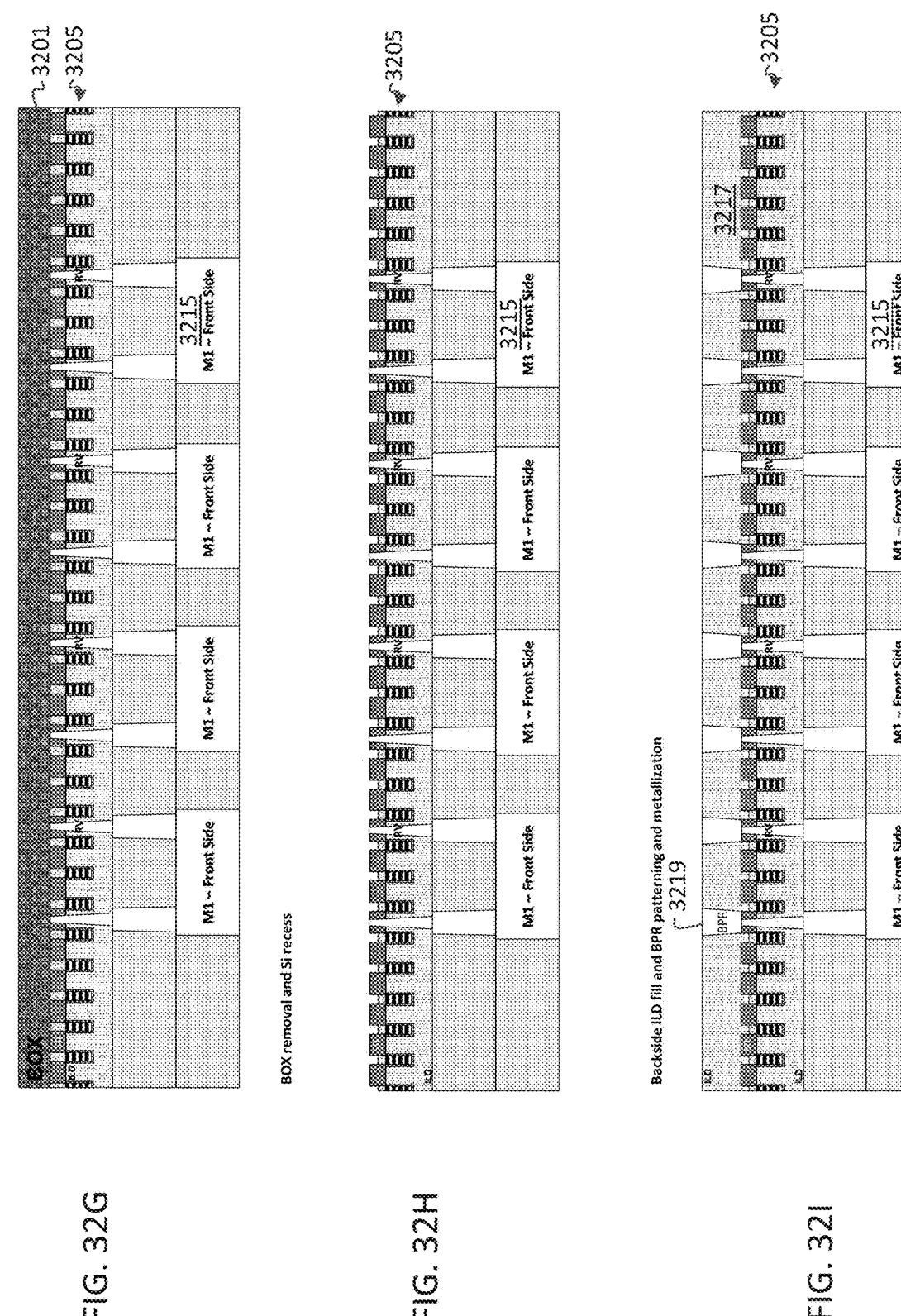
Figure 32J:
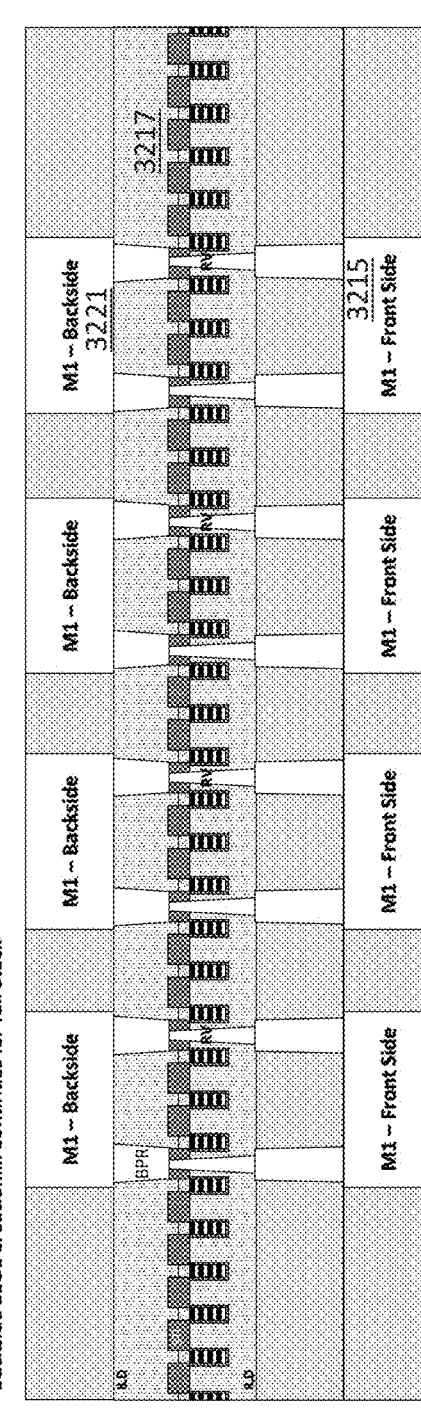

Now continuing, note the substrate 3201, buried oxide (BOX) 3203, and nanosheet stack region 3205 typically including alternating layers of Si and sacrificial SiGe, in a known manner. The nanosheets are patterned in FIG. 32B; note the patterned hard mask 3207. FIG. 32C depicts filling with shallow trench isolation (STI) 3209 and nanosheet reveal. FIG. 32D depicts the structure after FEOL process-ing; note the interlayer dielectric 3211. FIG. 32E depicts the structure after MOL processing; note the contact formation regions 3213. FIG. 32F depicts the structure during front side BEOL processing; note the front side M1 metal layer 3215. This continues until the entire BEOL stack is built and a carrier wafer is bonded to the top. The structure is then flipped over, as seen in FIG. 32G, and the substrate is thinned, stopping on an etch stop layer such as SiO₂ BOX in a known manner. FIG. 32H shows the structure after removal of the buried oxide and silicon recessing, while FIG. 32I shows the structure after backside ILD fill 3217 and BPR patterning and metallization (note BPRs 3219). FIG. 32J shows the structure during backside BEOL processing, which continues until the full stack is obtained; note the back side M1 metal layer 3221. The final structure is as shown in FIG. 29.

Additional Comments

In one or more non-limiting exemplary embodiments, the crackstop can be configured as a single continuous ring/ perimeter wall around the perimeter of the die, on the order of tens to hundreds of nanometers (nm), and can be formed, for example, using all the BEOL, metal, and via levels. In contrast, in one or more non-limiting exemplary embodi-ments, the fill structure can include hundreds or tens of thousands of discrete individual "bolts" with critical dimen-sion on the order of 10-1000 nm and can make use, for example, of 3-10 BEOL levels, 2-5 metal levels, 1-5 via levels, and can be, for example, discrete individual squares. In terms of the die build, in one or more non-limiting exemplary embodiments, both fill and crackstop structures provide mechanical strength with being electrically con-nected to the circuit; the fill structures can be located anywhere, while the crackstop structures can be located on the perimeter. In terms of purpose and function, the crack-stop structure can be configured, for example, to resist lateral (shear) forces, to block cracks (and moisture), and/or to provide a hermetic seal. The fill structure can be config-ured, for example, to resist vertical (tensile) forces and/or to facilitate processing uniformity, and typically, as a plurality of discrete bolts, does not provide a hermetic seal. Other embodiments could have different dimensions, configura-tions, and/or functionality.

It is worth noting that, as used herein, The "active region" is the region of a chip that includes power and signal wiring and active devices such as transistors. The active region or active device layer (ADL) can contain transistors, such as field effect transistors, contacts, and other well-known front end of line (FEOL)/middle of line (MOL) features. One or more embodiments include vias through the device region; embodiments with wires or vias and wires in the device region are also possible. One or more embodiments are useful in semiconductor circuits with gate pitch less than 100 nm.

Figures 26, 27:
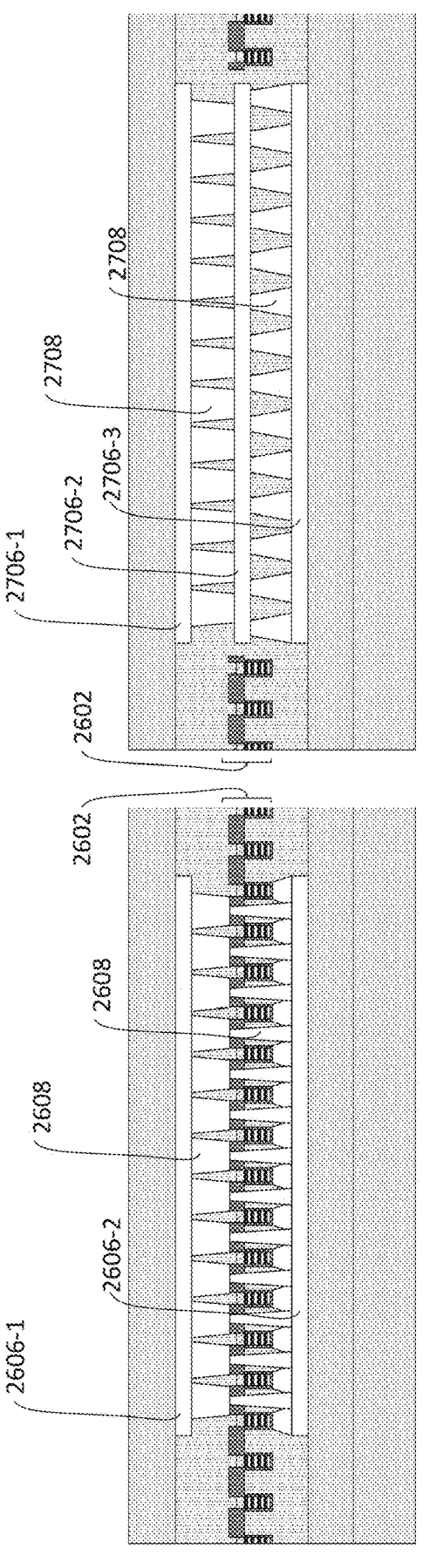
FIG. 26 depicts an exemplary embodiment with wiring in the device layer.
FIG. 27 depicts another exemplary embodiment with wiring in the device layer.

Thus, referring now to FIGS. 26 and 27, one or more embodiments include wiring in the device layer 2602. In FIG. 26 the wiring includes first and second metal plates, lines, or wires 2606-1, 2606-2, interconnected by vias 2608. In FIG. 27 the wiring includes first, second, and third metal plates, lines, or wires 2706-1, 2706-2, 2706-3, intercon-nected by vias 2708. Reference numbers are omitted for elements that have been described elsewhere herein, for convenience.

As used herein, note that "via bars" unless otherwise specified can include multilayer structures thereof. Further-more, sensors, such as crack sensors and/or moisture sen-sors, can be built in the top, bottom, across the active region, or combination. In addition, considering, e.g., crack sensors and methods for fabrication same, in one or more embodi-ments, the metal body metal body electrically interconnect-ing first and second sense pads can be, for example, any of the p-line stitch (crack sensor) embodiments disclosed herein. Furthermore, in various moisture sensing embodi-ments, a capacitor that couples a first sense pad to a second sense pad does so via capacitive coupling.

Exemplary Methods of Making—General Comments

Figure 23:
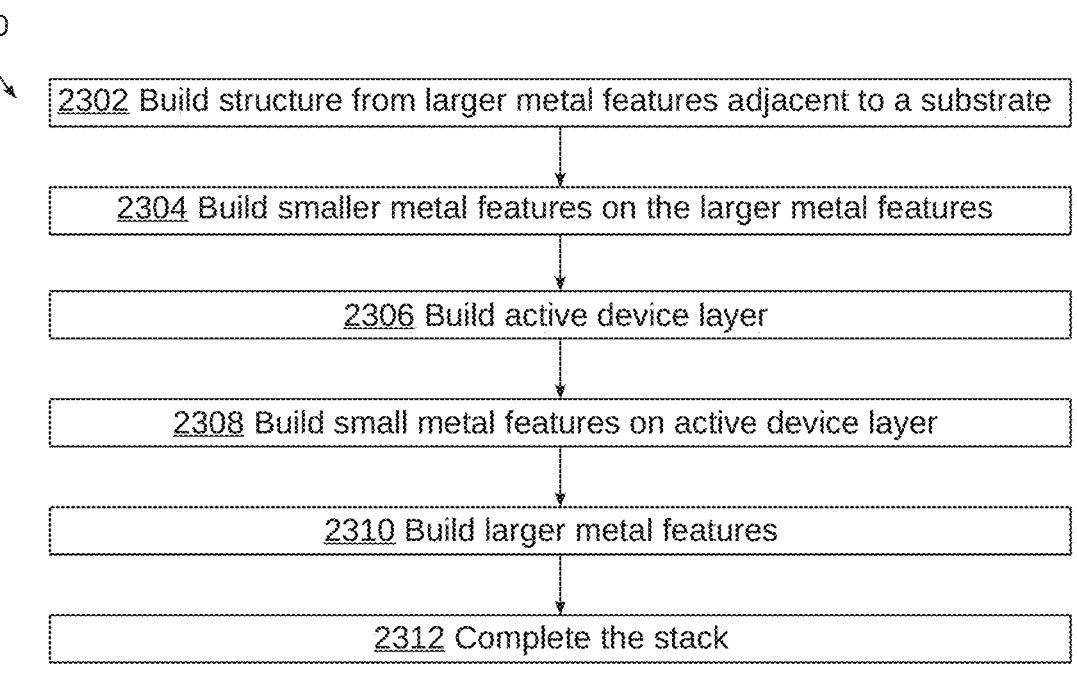
FIG. 23 depicts a flowchart of steps of a method for making a crack stop structure, according to exemplary embodiments.
Figure 24:
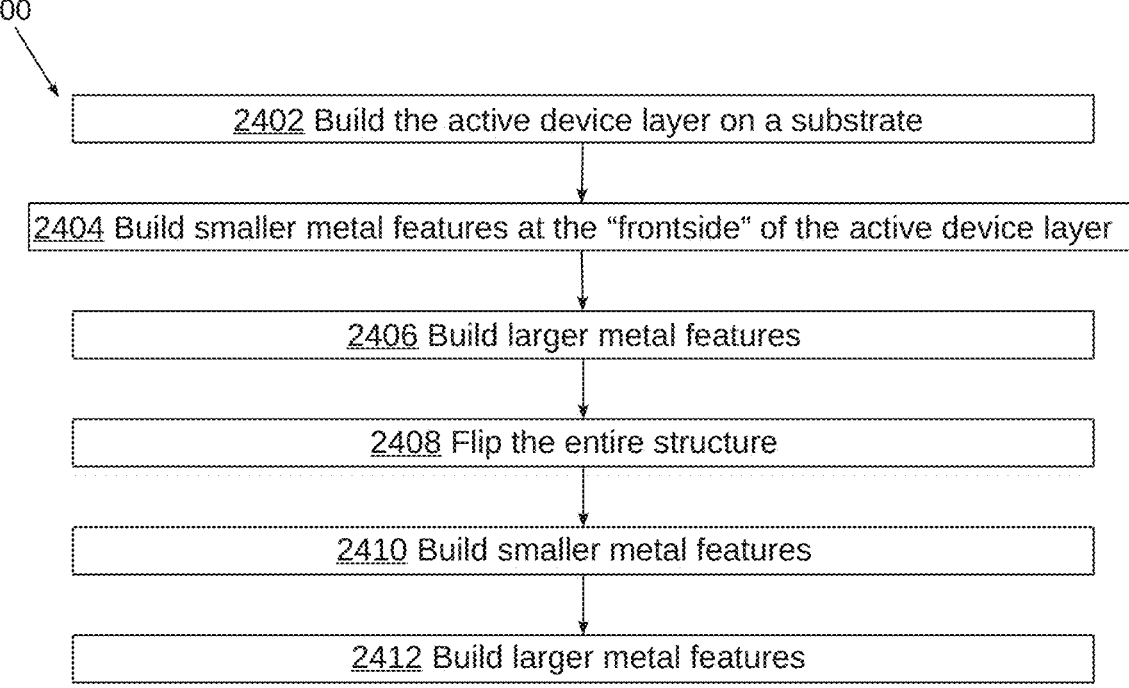
FIG. 24 depicts a flowchart of steps of a method for making a crack stop structure, according to exemplary embodiments.

As noted, and as will be appreciated by the skilled artisan given the teachings herein, structures described herein can be made in various ways. For example, referring to the crack stops and to the guard ring, such structures can be formed in a "backside first" manner 2300 (as shown in FIG. 23)—in which all the structure is built up from larger metal features adjacent to a substrate (at step 2302), then to smaller metal features (at step 2304), then to the active device layer (at step 2306), then to more small metal features (step 2308), then to larger metal features (step 2310), and finally completing the stack (step 2312). On the other hand, such structures equally could be formed in a "backside last" manner 2400 (as shown in FIG. 24)—in which first the active device layer is built (step 2402), then smaller metal features are built at the "frontside" of the active device layer (step 2404), followed by larger metal features (step 2406), then the entire structure is flipped (step 2408) and another sequence of smaller features (step 2410) and then larger metal features (step 2412) is built at the "backside" of the structure.

FIGS. 25A and 25B depict a process flow for making the variant crack stop 2200 that is shown in FIG. 22; FIGS. 25A and 25B are described with continuing reference to FIG. 22. First, build an active device layer 202 on a substrate; then, build a first via 2202 through the active device layer 202 into the substrate; then, at 2502, build smaller metal features at a frontside of the active device layer and build larger metal features onto the smaller metal features; at 2504, add a carrier wafer; at 2506, invert the structure; at 2508, strip the substrate to reveal a backside of the active device layer. Note that the horizontal block arrow shows a direction of the process flow and the downward pointing block arrow next to view 2508 indicates that flow moves to view 2510 in FIG. 25B. At 2510, build vias from the backside of the active device layer through the active device layer; at 2512, build additional vias; at 2514, build smaller metal features at the backside of the active device layer; at 2516, build larger metal features on the smaller metal features.

One or more embodiments accordingly provide a structure including brittle regions disposed between two substrates, each substrate having a side in contact with the brittle region and each substrate have a side not in contract with the brittle region; and a through via extending from the sides of each substrate in contact with the brittle region and extending through the brittle region. This structure can be in an active or non-active (e.g., "fill") region.

In one or more embodiments, the structure further includes, and/or the previously recited elements are incorporated into, an element selected from the group consisting of a crackstop, a guard ring and a crack sensor.

Some embodiments include a capacitive structure as moisture sensor.

Some embodiments include a guard ring that passes through the brittle region and also into at least one of each substrate.

In some embodiments, the through via has a non-uniform cross-sectional dimension along the length of the through via.

Some embodiments include relatively "tall" vias through through weak/brittle region(s).

Some embodiments include vias of varying height, starting, and/or terminating locations; for example, encompassing a plurality of through vias of varying length/height between a plurality of locations in the structure.

Some embodiments provide a crackstop with a bumper structure on the front and/or backside.

Given the discussion thus far, and referring to the "crack sensor" discussion, it will be appreciated that, in general terms, an exemplary structure, according to an aspect of the invention, includes a semiconductor substrate; a plurality of first dielectric layers at a top side of the semiconductor substrate; an active device layer at a top side of the plurality of first dielectric layers; a plurality of second dielectric layers at a top side of the active device layer; first and second sense pads; and a metal body that electrically connects the first sense pad to the second sense pad. The metal body includes: a first portion that is embedded in the plurality of first dielectric layers, wherein the first portion includes a first plurality of discrete segments; a second portion that is embedded in the plurality of second dielectric layers, wherein the second portion includes a second plurality of discrete segments, of which a first segment is electrically connected to the first sense pad and a second segment is electrically connected to the second sense pad; and a plurality of vias that interconnect the first portion to the second portion through the active device layer, wherein each of the vias connects one of the first portion segments to one of the second portion segments in such a way that breaking any of the vias reduces the electrical connectivity of the metal body between the first sense pad and the second sense pad.

Optionally, the vias are arranged in such a way that breaking any of the vias breaks the electrical connectivity of the metal body between the first sense pad and the second sense pad.

In some cases, the metal body includes stitches through the active device layer.

In some embodiments, all the segments of the first portion are embedded in the same one of the first dielectric layers.

In some embodiments, all the segments of the first portion are embedded in one of the first dielectric layers that is adjacent to the active device layer.

In some cases, all the segments of the second portion are embedded in the same one of the second dielectric layers.

In some cases, all the segments of the second portion are embedded in one of the second dielectric layers that is adjacent to the active device layer.

Optionally, each of the vias has the same height as the other vias.

In some cases, the first portion has diffusion barrier liners on surfaces of its metal lines and vias that face toward the active device layer and the second portion has diffusion barrier liners on surfaces of its metal lines and vias that face toward the active device layer.

The first and second sense pads can be disposed, for example, at a top side of the second dielectric layers.

Still referring to the "crack sensor" discussion, it will be appreciated that, in general terms, an exemplary structure, according to another aspect of the invention, includes a semiconductor substrate, wherein the semiconductor substrate comprises a bonding layer; a plurality of first dielectric layers at a top side of the semiconductor substrate; an active device layer at a top side of the plurality of first dielectric layers; a plurality of second dielectric layers at a top side of the active device layer; first and second sense pads at a top side of the second dielectric layers; and a metal body that electrically connects the first sense pad to the second sense pad. The metal body includes: a first portion that is embedded in the plurality of first dielectric layers, wherein the first portion includes a plurality of discrete segments, of which a first segment is electrically connected to the first sense pad and a second segment is electrically connected to the second sense pad; a conductive pattern, which is located in the semiconductor substrate and includes a plurality of discrete segments; and a plurality of electrical connections that interconnect the first portion to the conductive pattern through the bonding layer. Each of the electrical connections connects one of the first portion segments to one of the conductive pattern segments in such a way that breaking any of the electrical connections reduces the electrical connectivity of the metal body between the first sense pad and the second sense pad.

In some cases, each of the electrical connections to the conductive pattern in the semiconductor substrate through the bonding layer is at least one of a metal wire, a doped region of semiconductor, or a thinned portion of the bonding layer.

In some instances, the electrical connections are arranged in such a way that breaking any of the electrical connections breaks the electrical connectivity of the metal body between the first and second sense pads.

Optionally, the first portion has diffusion barrier liners on surfaces of its metal lines and vias that face toward the active device layer and the second portion has diffusion barrier liners on surfaces of its metal lines and vias that face toward the active device layer.

Still referring to the "crack sensor" discussion, it will be appreciated that, in general terms, an exemplary structure, according to still another aspect of the invention, includes a semiconductor substrate, wherein the semiconductor substrate comprises a bonding layer; a plurality of first dielectric layers at a top side of the semiconductor substrate; an active device layer at a top side of the plurality of first dielectric layers; a plurality of second dielectric layers at a top side of the active device layer; first and second sense pads at a top side of the second dielectric layers; and a metal body that electrically connects the first sense pad to the second sense pad. The metal body includes: a conductive pattern, which is located in the semiconductor substrate below the bonding layer and includes a first plurality of discrete segments; a first portion that is embedded in the plurality of second dielectric layers, wherein the second portion includes a second plurality of discrete segments, of which a first segment is electrically connected to the first sense pad and a second segment is electrically connected to the second sense pad; and a plurality of vias that interconnect the second portion to the conductive pattern through the active device layer, the first dielectric layers, and the bonding layer, wherein each of the vias connects one of the second portion segments to one of the conductive pattern segments in such a way that breaking any of the vias reduces the electrical connectivity of the metal body between the first sense pad and the second sense pad.

In some cases, the vias are arranged in such a way that breaking any of the vias breaks the electrical connectivity of the metal body between the first sense pad and the second sense pad.

Some embodiments further include an electrical connection between the semiconductor substrate and the first portion of the metal body in a continuous ring around the perimeter of the structure.

In some cases, the first portion has diffusion barrier liners on surfaces of its metal lines and vias that face toward the active device layer and the second portion has diffusion barrier liners on surfaces of its metal lines and vias that face toward the active device layer.

Referring now to the "backside last" method 2400 (as shown in FIG. 24) for crack sensors, an exemplary method for making a crack sensor for an integrated circuit structure includes: building an active device layer on a substrate, such that the active device layer is located outward of a plurality of first dielectric layers at a top side of the substrate and inward of a plurality of second dielectric layers, as at 2402; building smaller metal features at a frontside of the active device layer, as at 2404; building larger metal features onto the smaller metal features, as at 2406; inverting the structure, as at 2408; building smaller metal features adjacent to the backside of the active device layer, as at 2410; and building backside vias from the backside of the active device layer through the active device layer to smaller and larger metal features at the frontside of the active device layer, as at 2412. The frontside smaller metal features, the frontside larger metal features, the backside smaller metal features and the backside vias are built to form a metal body electrically interconnecting first and second sense pads.

Optionally, the method further includes detecting a crack by connecting a continuity tester between the first and second sense pads.

Referring now to the "backside first" method 2300 (as shown in FIG. 23) for crack sensors, an exemplary method for making a crack sensor for an integrated circuit structure includes: building a structure from a plurality of first metal features adjacent a substrate, as at 2302; building a plurality of second metal features on the first metal features, the second metal features being smaller than the first metal features, as at 2304; building an active device layer outward of the second metal features, such that the active device layer is located outward of a plurality of first dielectric layers at a top side of the substrate and inward of a plurality of second dielectric layers, as at 2306; building third metal features on the active device layer, as at 2308; building fourth metal features on the third metal features, to obtain an intermediate structure, the fourth metal features being larger than the third metal features, as at 2310; and completing a stack including the intermediate structure, as at 2312. The first, second, third, and fourth metal features are built to form a metal body electrically interconnecting first and second sense pads.

Optionally, the method further includes detecting a crack by connecting a continuity tester between the first and second sense pads.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. For example, the skilled artisan will be familiar with epitaxial growth, self-aligned contact formation, formation of high-K metal gates, and so on. The term "high-K" has a definite meaning to the skilled artisan in the context of high-K metal gate (HKMG) stacks, and is not a mere relative term. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1$^{st}$ Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products.

An integrated circuit in accordance with aspects of the present inventions can be employed in essentially any application and/or electronic system. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

Indeed, the descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate;
a plurality of first dielectric layers at a top side of the semiconductor substrate;
an active device layer at a top side of the plurality of first dielectric layers;
a plurality of second dielectric layers at a top side of the active device layer;
first and second sense pads; and
a metal body that electrically connects the first sense pad to the second sense pad, wherein the metal body comprises:
a first portion that is embedded in the plurality of first dielectric layers, wherein the first portion includes a first plurality of discrete segments;
a second portion that is embedded in the plurality of second dielectric layers, wherein the second portion includes a second plurality of discrete segments, of which a first segment is electrically connected to the first sense pad and a second segment is electrically connected to the second sense pad; and
a plurality of vias that interconnect the first portion to the second portion through the active device layer, wherein each of the vias connects one of the first plurality of discrete segments to one of the second plurality of descrete segments in such a way that breaking any of the vias reduces the electrical connectivity of the metal body between the first sense pad and the second sense pad.

2. The structure of claim 1, wherein the vias are arranged in such a way that breaking any of the vias breaks the electrical connectivity of the metal body between the first sense pad and the second sense pad.

3. The structure of claim 1, wherein the metal body comprises stitches through the active device layer.

4. The structure of claim 1, wherein all of the plurality of discrete segments of the first portion are embedded in a same one of the first dielectric layers.

5. The structure of claim 1, wherein all of the plurality of discrete segments of the first portion are embedded in one of the first dielectric layers that is adjacent to the active device layer.

6. The structure of claim 1, wherein all of the plurality of discrete segments of the second portion are embedded in a same one of the second dielectric layers.

7. The structure of claim 1, wherein all of the plurality of discrete segments of the second portion are embedded in one of the second dielectric layers that is adjacent to the active device layer.

8. The structure of claim 1, wherein each of the vias has a same height as the other vias.

9. The structure of claim 1, wherein the first portion has diffusion barrier liners on surfaces of its metal lines and vias that face toward the active device layer and the second portion has diffusion barrier liners on surfaces of its metal lines and vias that face toward the active device layer.

10. The structure of claim 1, wherein the first and second sense pads are disposed at a top side of the second dielectric layers.

* * * * *